(12) United States Patent
Tien et al.

(10) Patent No.: US 11,024,533 B2
(45) Date of Patent: Jun. 1, 2021

(54) METHODS OF FORMING INTERCONNECT STRUCTURES USING VIA HOLES FILLED WITH DIELECTRIC FILM

(71) Applicant: Taiwan Semiconductor Manufacturing Co., Ltd., Hsinchu (TW)

(72) Inventors: Hsi-Wen Tien, Xinfeng Township, Hsinchu County (TW); Wei-Hao Liao, Taichung (TW); Pin-Ren Dai, New Taipei (TW); Chih-Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/413,906

(22) Filed: May 16, 2019

(65) Prior Publication Data
US 2020/0365451 A1 Nov. 19, 2020

(51) Int. Cl.
*H01L 21/768* (2006.01)
*H01L 23/522* (2006.01)

(52) U.S. Cl.
CPC .. *H01L 21/76808* (2013.01); *H01L 21/76811* (2013.01); *H01L 21/76813* (2013.01);
(Continued)

(58) Field of Classification Search
CPC ......... H01L 21/76808; H01L 21/76877; H01L 21/76843; H01L 21/76813;
(Continued)

(56) References Cited

U.S. PATENT DOCUMENTS 7,101,790 B2 * 9/2006 Lee .................. H01L 21/76843
257/751
8,895,431 B2 * 11/2014 Harada ............... H01L 21/3205
438/637

(Continued)

OTHER PUBLICATIONS

Non-Final Office Action dated Aug. 7, 2020, issued in U.S. Appl. No. 16/396,965.

(Continued)

*Primary Examiner* — Khiem D Nguyen
(74) *Attorney, Agent, or Firm* — McClure, Qualey & Rodack, LLP

(57) ABSTRACT

A method of forming an interconnect structure for an integrated circuit device is provided. The method includes forming a wiring layer having a metal line, and forming a patterned disposable material layer over the wiring layer and having an opening aligned with the metal line. The method also includes depositing a first dielectric film in the opening and in contact with the metal line, and removing the patterned disposable material layer to leave the first dielectric film. The method further includes depositing a second dielectric film over the first dielectric film, and etching the second dielectric film to form a trench above the first dielectric film. In addition, the method includes removing a portion of the first dielectric film to form a via hole under the trench, and depositing a conductive material in the trench and the via hole.

20 Claims, 29 Drawing Sheets

(52) U.S. Cl.
CPC .. *H01L 21/76843* (2013.01); *H01L 21/76877* (2013.01); *H01L 23/5226* (2013.01); *H01L 2221/1021* (2013.01)

(58) Field of Classification Search
CPC .......... H01L 21/76811; H01L 23/5226; H01L 21/76802; H01L 21/76804; H01L 21/76805; H01L 21/76807; H01L 21/7681; H01L 21/76814; H01L 21/76829; H01L 21/76831; H01L 21/76832; H01L 21/76834; H01L 21/76844; H01L 21/76897; H01L 21/0337; H01L 21/31144; H01L 21/32139; H01L 21/768; H01L 21/7685; H01L 21/823475; H01L 23/528; H01L 23/53238; H01L 23/53295

See application file for complete search history.

(56) References Cited

U.S. PATENT DOCUMENTS

| | | | |
|---|---|---|---|
| 9,484,257 B2* | 11/2016 | Yao | H01L 21/76823 |
| 9,859,150 B2* | 1/2018 | Jung | H01L 21/31144 |
| 2004/0203223 A1* | 10/2004 | Guo | H01L 21/76808 438/637 |
| 2005/0124149 A1* | 6/2005 | Kim | H01L 21/31144 438/618 |
| 2006/0270068 A1* | 11/2006 | Lo | H01L 21/31144 438/7 |
| 2007/0020829 A1 | 1/2007 | Hotta et al. | |
| 2007/0037384 A1 | 2/2007 | Su et al. | |
| 2007/0123036 A1* | 5/2007 | Brakensiek | H01L 21/31133 438/636 |
| 2009/0166881 A1 | 7/2009 | Balakrishnan et al. | |
| 2014/0125421 A1 | 5/2014 | Miyazaki | |
| 2014/0175617 A1* | 6/2014 | Antonelli | H01L 21/76813 257/632 |
| 2014/0264947 A1* | 9/2014 | Lin | H01L 27/1469 |
| 2017/0018458 A1* | 1/2017 | Cheng | H01L 21/02068 |
| 2018/0033866 A1 | 2/2018 | Liao et al. | |

OTHER PUBLICATIONS

Final Office Action dated Feb. 19, 2021, issued in U.S. Appl. No. 16/396,965 (copy not provided).

* cited by examiner

METHODS OF FORMING INTERCONNECT STRUCTURES USING VIA HOLES FILLED WITH DIELECTRIC FILM

BACKGROUND

Semiconductor devices are used in a variety of electronic applications, such as personal computers, cell phones, digital cameras, and other electronic equipment. Semiconductor devices are typically fabricated by sequentially depositing dielectric layers, conductive layers, and semiconductor layers over a semiconductor substrate like a wafer, and patterning the various material layers using lithography and etching processes to form circuit components and elements on the wafer. Moreover, an interconnect structure is usually formed over the semiconductor devices to electrically connect the various semiconductor devices with each other, and the interconnect structure is further electrically coupled to an external circuit component.

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2, 1B-2, 1C-2, 1D-2, 1E-2, 1F-2, 1G-2, 1H-2, 1I-2, 1J-2, 1K-2, 1L-2, 1M-2 and 1N-2 show top views of the structures of FIGS. 1A-1 to 1N-1, respectively, at various stages of an exemplary method for fabricating an interconnect structure for an integrated circuit device, in accordance with some embodiments.

FIGS. 2A-1, 2B-1, 2C-1, 2D-1, 2E-1, 2F-1, 2G-1 and 2H-1 show cross-sectional views of structures at various stages of an exemplary method for fabricating an interconnect structure for an integrated circuit device, in accordance with some embodiments.

FIGS. 2A-2, 2B-2, 2C-2, 2D-2, 2E-2, 2F-2, 2G-2 and 2H-2 show top views of the structures of FIGS. 2A-1 to 2H-1, respectively, at various stages of an exemplary method for fabricating an interconnect structure for an integrated circuit device, in accordance with some embodiments.

DETAILED DESCRIPTION

Figures 1, 1A:
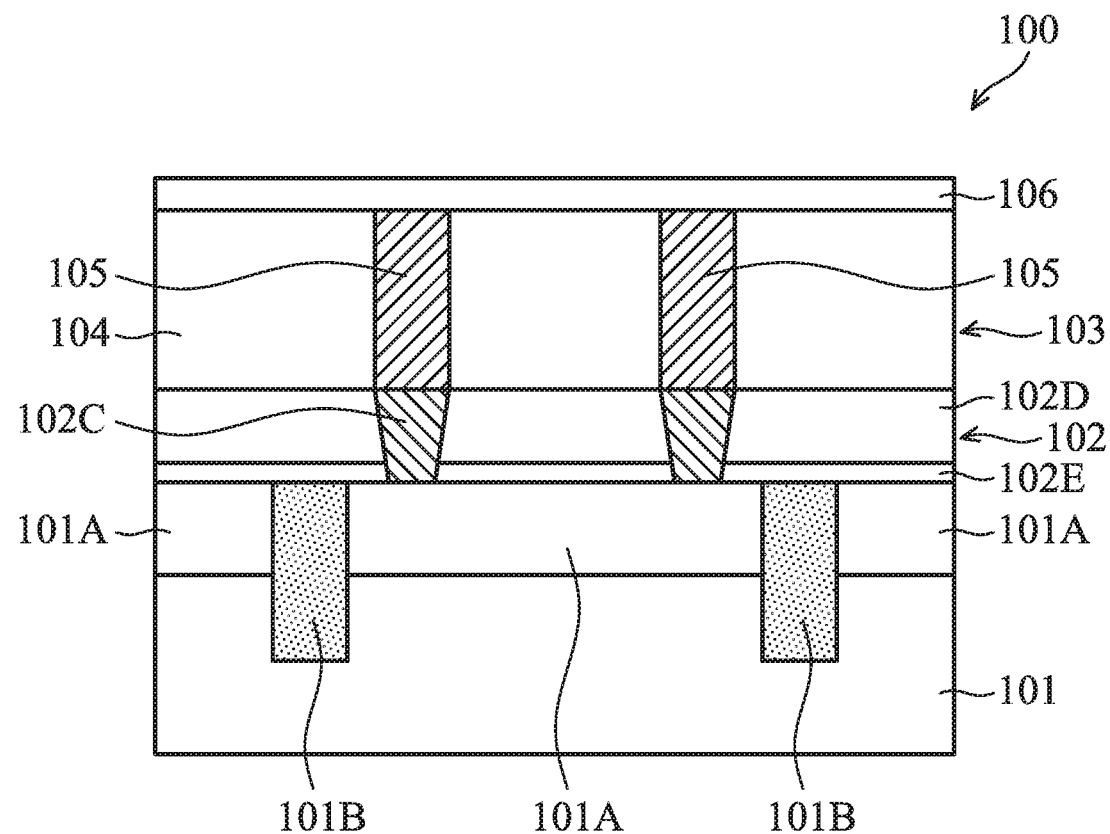
FIGS. 1A-1, 1B-1, 1C-1, 1D-1, 1E-1, 1F-1, 1G-1, 1H-1, 1I-1, 1J-1, 1K-1, 1L-1, 1M-1 and 1N-1 show cross-sectional views of structures at various stages of an exemplary method for fabricating an interconnect structure for an integrated circuit device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to fabricating interconnect structures for integrated circuit devices. The interconnect structures are fabricated using self-aligned via hole etching by filling a dielectric film first in via holes to form a conductive via. In some embodiments of the disclosure, a first dielectric film is deposited in openings of a disposable material layer such as a bottom anti-reflective coating (BARC) layer. The first dielectric film is in contact with the metal lines of an underlying wiring layer. Afterwards, the BARC layer is removed and the first dielectric film is left on the metal lines. Next, a second dielectric film is deposited over the first dielectric film. The second dielectric film is etched to form a trench above the first dielectric film, and then the first dielectric film is etched to form a via hole. The via hole is surrounded by the remaining portion of the first dielectric film. Afterwards, the trench and the via hole are filled with a conductive material to form a conductive line and a conductive via. The conductive line and the conductive via constitute an integrated structure that is embedded in the second dielectric film and is a part of the interconnect structure.

In some embodiments, the conductive line and the conductive via as described above are formed in a middle-end-of-line (MEOL) process for a semiconductor device. The semiconductor device is for example Fin Field Effect Transistor (FinFET), planar FET, π-gate FET, Ω-gate FET, Gate-All-Around (GAA) FET, complementary metal-oxide-semiconductor (CMOS) image sensor, or another semiconductor device. The conductive via is electrically connected to the contact of a source region, a drain region or a gate electrode in the semiconductor device. The conductive line and the conductive via are embedded in the same dielectric layer to be a lower interconnect layer of an interconnect structure for an integrated circuit device. The lower interconnect layer may further include additional metal lines and vias.

In some embodiments, the conductive line and the conductive via as described above are formed in a back-end-of-line (BEOL) process for an integrated circuit device. The integrated circuit device includes various active components and passive components. The active components may be photodiodes, planar FETs, FinFETs or other transistors. The passive components are, for example, resistors, capacitors, and inductors. The active components and the passive components of the integrated circuit device are electrically coupled through an interconnect structure. The conductive vias formed by the embodiments of the disclosure may be electrically connected to metal lines of an underlying wiring layer. The conductive line and the conductive vias as described above may constitute an upper interconnect layer of the interconnect structure for the integrated circuit device. The interconnect structure may further include one or more additional interconnect layers disposed under or above the interconnect layer that includes the conductive vias of the embodiments of the disclosure. Moreover, the additional interconnect layers may also include the conductive vias of the embodiments of the disclosure.

According to the embodiments of disclosure, the formation of the conductive via can avoid via overlay shift and via top rounding issues. Moreover, the embodiments of the disclosure can precisely control the critical dimension (CD) of the conductive via to prevent the CD from enlarging. Therefore, the interconnect structures of the embodiments of the disclosure are suitable for small pitch and CD of vias and small pitch of conductive lines. In addition, the reliability of the integrated circuit devices is thereby improved. According to the benefits mentioned above, the embodiments of the disclosure are applicable for integrated circuit devices at technology nodes of 20 nm (N20), 16 nm (N16), 10 nm (N10), 7 nm (N7), 5 nm (N5), 3 nm (N3) and beyond.

The foregoing broadly outlines some aspects of the embodiments described herein. Some embodiments described herein are described in the context of interconnect structures for integrated circuit devices. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

FIGS. 1A-1, 1B-1, 1C-1, 1D-1, 1E-1, 1F-1, 1G-1, 1H-1, 1I-1, 1J-1, 1K-1, 1L-1, 1M-1 and 1N-1 show cross-sectional views of structures at various stages of an exemplary method for fabricating an interconnect structure for an integrated circuit device 100, in accordance with some embodiments. FIGS. 1A-2, 1B-2, 1C-2, 1D-2, 1E-2, 1F-2, 1G-2, 1H-2, 1I-2, 1J-2, 1K-2, 1L-2, 1M-2 and 1N-2 show top views of the structures of FIGS. 1A-1 to 1N-1 at various stages of the exemplary method for fabricating the interconnect structure for the integrated circuit device 100, in accordance with some embodiments. The cross-sectional views of the structures of FIGS. 1A-1 to 1N-1 are taken along line I-I of FIGS. 1A-2 to 1N-2, respectively.

The integrated circuit device 100 may be a portion of an IC chip or a system on chip (SoC). The integrated circuit device 100 may include a microprocessor, a memory, and/or other device. In some embodiments, the integrated circuit device 100 includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, another suitable component, or a combination thereof. The transistors may be planar transistors or other transistors, such as FinFETs. All figures of the embodiments have been simplified for the sake of clarity to better understand the inventive concepts of the present disclosure. Additional features can be added in the integrated circuit device 100, and some of the features described below can be replaced, modified, or eliminated in other embodiments of the integrated circuit device.

The integrated circuit device 100 includes a semiconductor substrate 101 that has Field Effect Transistors (FETs), for example planar FETs, FinFETs or another semiconductor device formed therein. Moreover, multiple passive components, for example, resistors, capacitors, and inductors may be formed over the semiconductor substrate 101. The semiconductor substrate 101 may be a bulk semiconductor substrate, a semiconductor-on-insulator (SOI) substrate, or another semiconductor substrate, which may be doped (e.g., with a p-type or an n-type dopant) or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 101 may be made of silicon or another semiconductor material. For example, the semiconductor substrate 101 is a silicon wafer. In some examples, the semiconductor substrate 101 is made of a compound semiconductor such as silicon carbide, gallium arsenic, indium arsenide, or indium phosphide. In some examples, the semiconductor substrate 101 is made of an alloy semiconductor such as GaAsP, AlInAs, AlGaAs, GaInAs, GaInP, or GaInAsP.

The semiconductor substrate 101 includes multiple active regions 101A and each of the active regions 101A is surrounded by an isolation structure 101B in the semiconductor substrate 101, as shown in FIG. 1A-1 in accordance with some embodiments. The isolation structure 101B defines and electrically isolates the active region 101A from another active region 101A. The isolation structure 101B is for example a shallow trench isolation (STI) region, a deep trench isolation (DTI) region, or a local oxidation of silicon (LOCOS) region. The material of the isolation structure 101B includes silicon oxide, silicon nitride, silicon oxynitride, another suitable insulating material, or a combination thereof. The active region 101A may include various transistors as those described above, and not repeated again.

A contact etch stop layer (CESL) 102E is formed over the active regions 101A, the isolation structures 101B and the semiconductor substrate 101. An interlayer dielectric (ILD) layer 102D is formed on the CESL 102E. Multiple contacts 102C are formed in the ILD layer 102D and pass through the CESL 102E to electrically connect to the devices in the active regions 101A. The CESL 102E, the ILD layer 102D and the contacts 102C may be referred to as a contact structure layer 102.

Generally, the CESL 102E can provide a mechanism to stop an etching process when forming contact holes of the contacts 102C. The CESL 102E can be formed of a dielectric material that has an etch selectivity different from adjacent layers, for example, the ILD layer 102D. The CESL 102E may be made of silicon nitride, silicon carbon nitride, silicon carbon oxide, or a combination thereof, and may be deposited by chemical vapor deposition (CVD), plasma enhanced CVD (PECVD), atomic layer deposition (ALD), or another deposition technique.

The ILD layer 102D may be made of silicon dioxide, silicon oxynitride, a low-k dielectric material (e.g., a material having a dielectric constant (k value) lower than k value (about 3.9) of silicon dioxide), such as phosphosilicate glass (PSG), borosilicate glass (BSG), borophosphosilicate glass (BPSG), undoped silicate glass (USG), fluorinated silicate glass (FSG), organosilicate glasses (OSG), SiOxCy, spin-on-glass (SOG), spin-on-polymers, silicon carbon material, or a combination thereof. The ILD layer 102D may be deposited by spin-on coating, CVD, flowable CVD (FCVD), PECVD, physical vapor deposition (PVD), or another deposition technique.

Next, contact holes are formed in the ILD layer 102D and passes through the CESL 102E using photolithography and etching processes. Afterwards, a conductive material of the contacts 102C is deposited on the ILD layer 102D and to fill the contact holes. The conductive material includes a metal, such as cobalt, tungsten, copper, aluminum, gold, silver, alloys thereof, or a combination thereof. The conductive material may be deposited by CVD, ALD, PVD, or another deposition technique. Afterwards, a planarization process, such as a chemical mechanical polishing (CMP) process, may be performed to remove excess portions of the conductive material from the top surface of the ILD layer 102D to form the contacts 102C.

Next, a wiring layer 103 is formed on the contact structure layer 102, as shown in FIG. 1A-1 in accordance with some embodiments. The wiring layer 103 includes multiple metal lines 105 embedded in a dielectric layer 104. The dielectric layer 104 is also referred to as an inter-metal dielectric (IMD) layer. The metal lines 105 are electrically connected to the contacts 102C respectively. The material of the dielectric layer 104 includes silicon carbide (SiC), silicon dioxide ($SiO_2$), silicon oxycarbide (SiOC), silicon nitride (SiN), silicon carbon nitride (SiCN), silicon oxynitride (SiON), silicon carbon oxynitride (SiOCN), a low-k dielectric material (e.g., a material has a k-value lower than about 3.9) or a combination thereof. The low-k dielectric material is for example PSG, BSG, BPSG, USG, FSG, OSG, SOG, carbon doped silicon oxide, Black Diamond® (Applied Materials of Santa Clara, Calif.), Xerogel, Aerogel, amorphous fluorinated carbon, parylene, benzocyclobutene (BCB), SiLK (Dow Chemical, Midland, Mich.) or polyimide. The dielectric layer 104 may be deposited at a temperature of about 30° C. to about 400° C. by spin-on coating, CVD, FCVD, PECVD, PVD, or another deposition technique. In some examples, the dielectric layer 104 has a thickness that is in a range from about 30 Å to about 800 Å.

In some embodiments, the material of the metal lines 105 includes Ta, TaN, TiN, Cu, Co, Ru, Mo, W or a combination thereof. The metal lines 105 may be formed using photolithography, etching and deposition processes. The deposition process is for example, PVD, CVD, ALD, electrochemical plating (ECP), electroless deposition (ELD) or spin-on coating process and may be performed at a temperature of about 150° C. to about 400° C. In some examples, the metal lines 105 have a thickness that is in a range from about 10 Å to about 1000 Å.

Figures 1, 1A, 2:
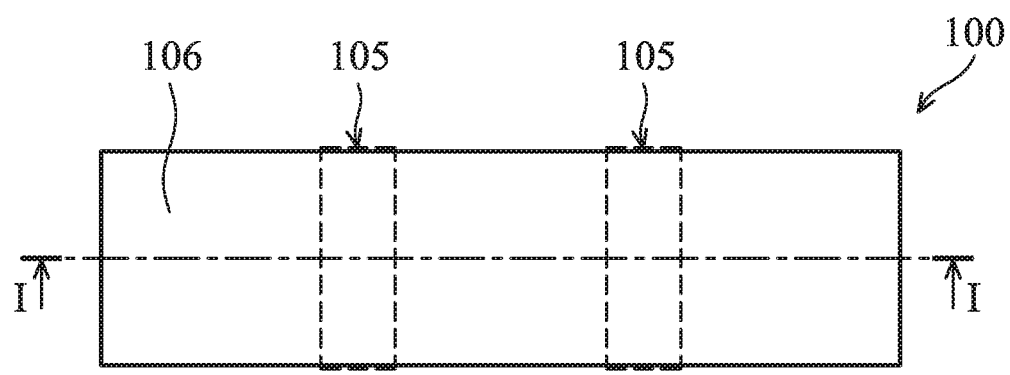

Next, an etch stop layer 106 is deposited on the wiring layer 103, as shown in FIG. 1A-1 in accordance with some embodiments. The material of the etch stop layer 106 is different from the material of the dielectric layer 104. The material of the etch stop layer 106 includes silicon nitride, silicon oxynitride, silicon carbon nitride, silicon carbon oxide, or a combination thereof, and may be deposited by CVD, PECVD, ALD, or another deposition technique. In some examples, the etch stop layer 106 has a thickness that is in a range from about 1 Å to about 200 Å. FIG. 1A-2 shows a top view of the structure of FIG. 1A-1 in accordance with some embodiments. The cross-sectional view of FIG. 1A-1 is taken along line I-I of FIG. 1A-2. The metal lines 105 are disposed under the etch stop layer 106 and are parallel with each other. In some embodiments, the metal lines 105 are extended in a first direction, for example a Y-axial direction.

Figures 1, 1B:
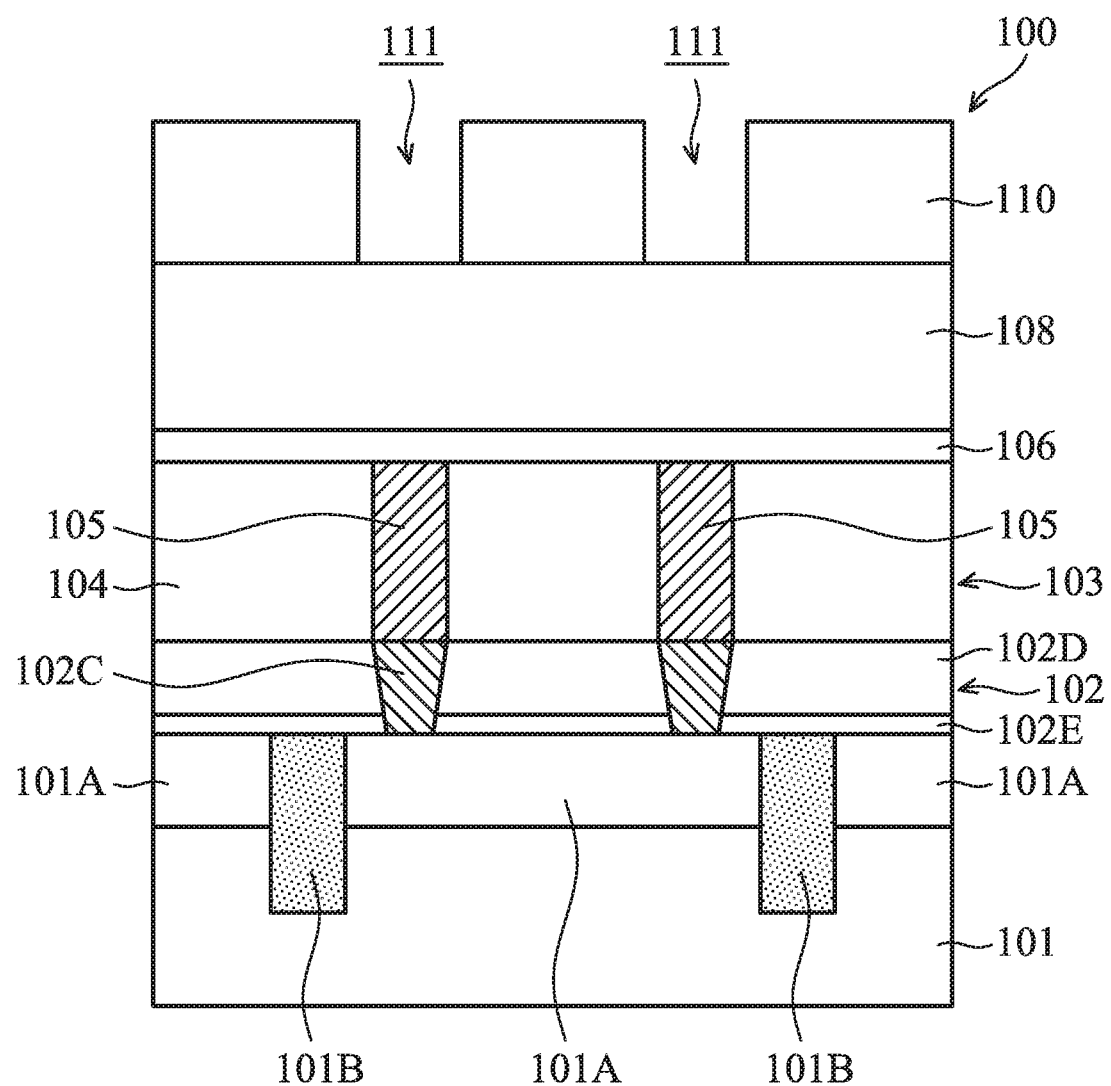
Figures 1, 1B, 2:
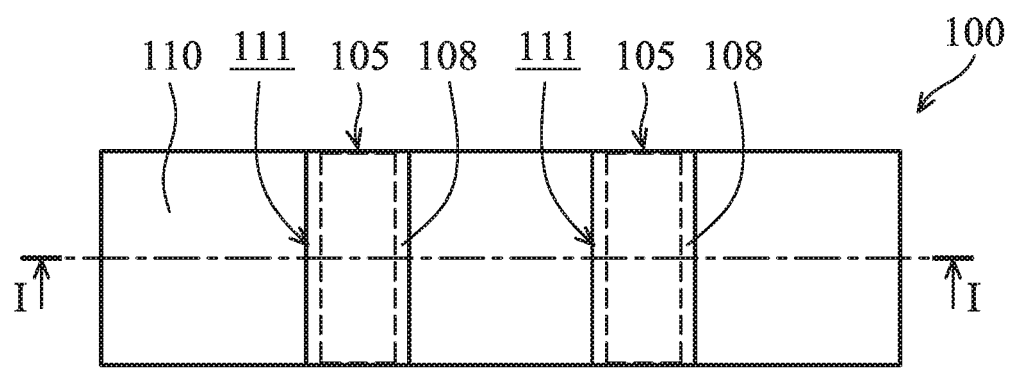

Afterwards, a disposable material layer such as a bottom anti-reflective coating (BARC) layer 108 is formed on the etch stop layer 106, as shown in FIG. 1B-1 in accordance with some embodiments. The material of the disposable material layer or the BARC layer 108 may be an organic or inorganic insulating material and may be coated by spin-on coating process or deposited by CVD, PECVD or another deposition technique. In some embodiments, the disposable material layer or the BARC layer 108 has a thickness that is in a range from about 80 Å to about 1200 Å.

Next, a patterned mask such as a patterned photoresist layer 110 is formed on the BARC layer 108, as shown in FIG. 1B-1 in accordance with some embodiments. The patterned photoresist layer 110 is formed using a photolithography process and has multiple openings 111 to expose portions of the BARC layer 108. FIG. 1B-2 shows a top view of the structure of FIG. 1B-1 in accordance with some embodiments. The cross-sectional view of FIG. 1B-1 is taken along line I-I of FIG. 1B-2. The openings 111 of the patterned photoresist layer 110 are aligned with the metal lines 105, as shown in FIG. 1B-2 in accordance with some embodiments. The shape of the openings 111 may be a rectangle that is parallel with the metal lines 105 and may be wider than the metal lines 105.

Figures 1, 1C:
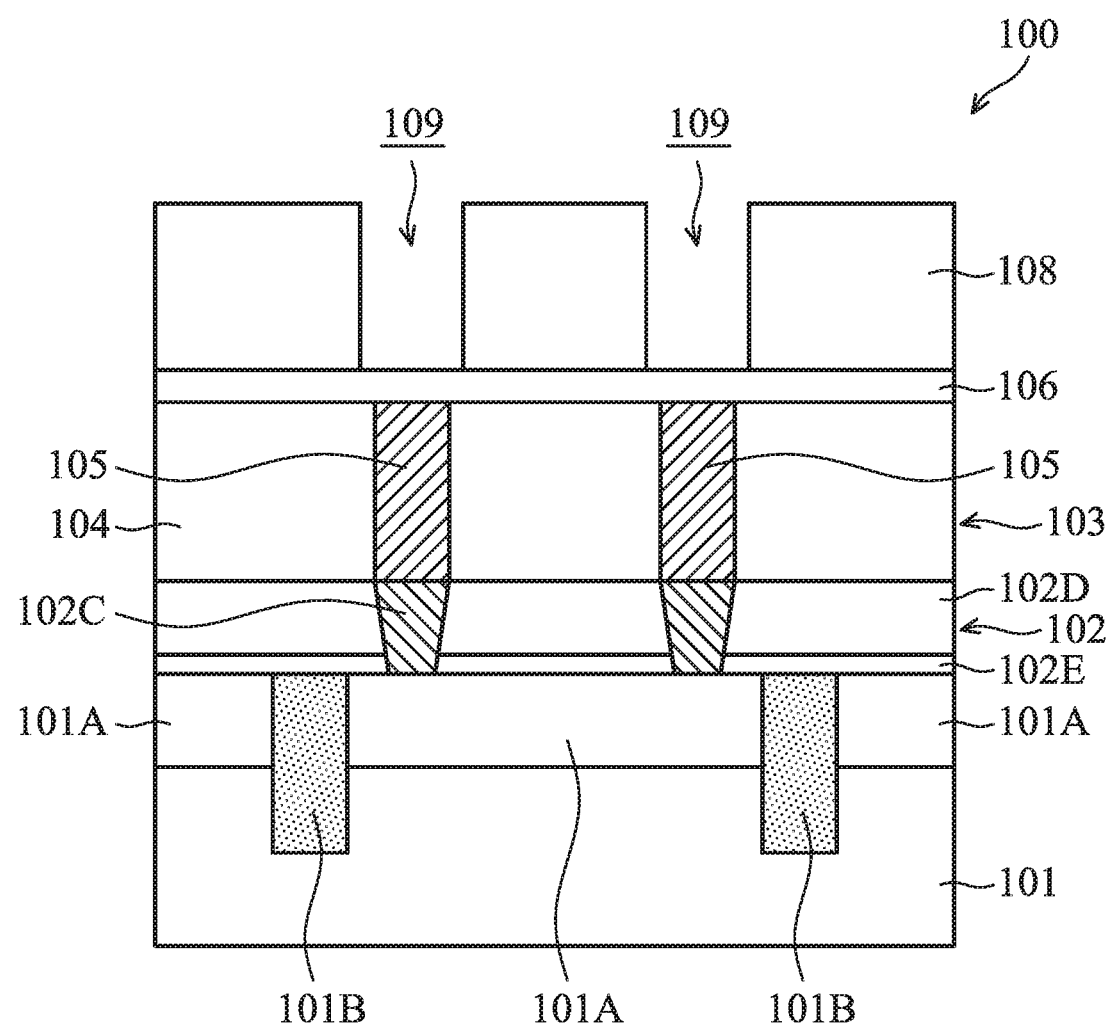
Figures 1, 1C, 2:
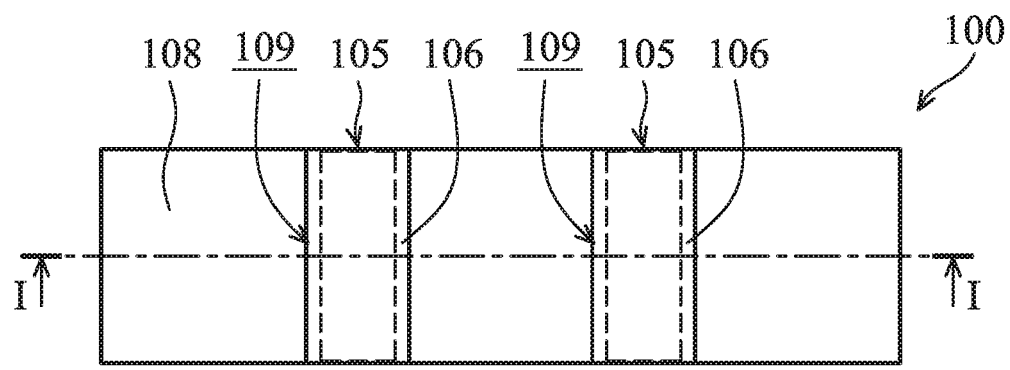

Afterwards, the patterned photoresist layer 110 is used as an etch mask in an etching process to form multiple openings 109 in the BARC layer 108, as shown in FIG. 1C-1 in accordance with some embodiments. The etching process is anisotropic and is a dry etching process such as reactive ion etch (RIE), neutral beam etch (NBE), or a combination thereof. The dry etching process may be performed with fluorine-based plasma and may use etch gases selected from a group consisting of $C_4F_8$, $C_4F_6$, $CF_4$, $CHF_3$, $CH_2F_2$, $CH_3F$, Ar, He, $Cl_2$, $N_2$, $H_2$, $O_2$ and HBr. The BARC layer 108 has an etching selectivity to the etch stop layer 106 in the etching process. In some examples, the etch selectivity is in a range from about 10 to about 100. After the openings 109 are formed to pass through the BARC layer 108, the etching process stops on the etch stop layer 106. Subsequently, the patterned photoresist layer 110 is removed using, for example, an ashing process or a wet strip process.

FIG. 1C-2 shows a top view of the structure of FIG. 1C-1 in accordance with some embodiments. The cross-sectional view of FIG. 1C-1 is taken along line I-I of FIG. 1C-2. The openings 109 of the BARC layer 108 are aligned with the metal lines 105 and expose portions of the etch stop layer 106, as shown in FIG. 1C-2 in accordance with some embodiments. The shape of the openings 109 may be a rectangle that is parallel with the metal lines 105 and may be wider than the metal lines 105. The shape and the size of the openings 109 of the BARC layer 108 may be the same as those of the openings 111 of the patterned photoresist layer 110. The openings 109 of the BARC layer 108 may be referred to as trenches.

Figures 1, 1D:
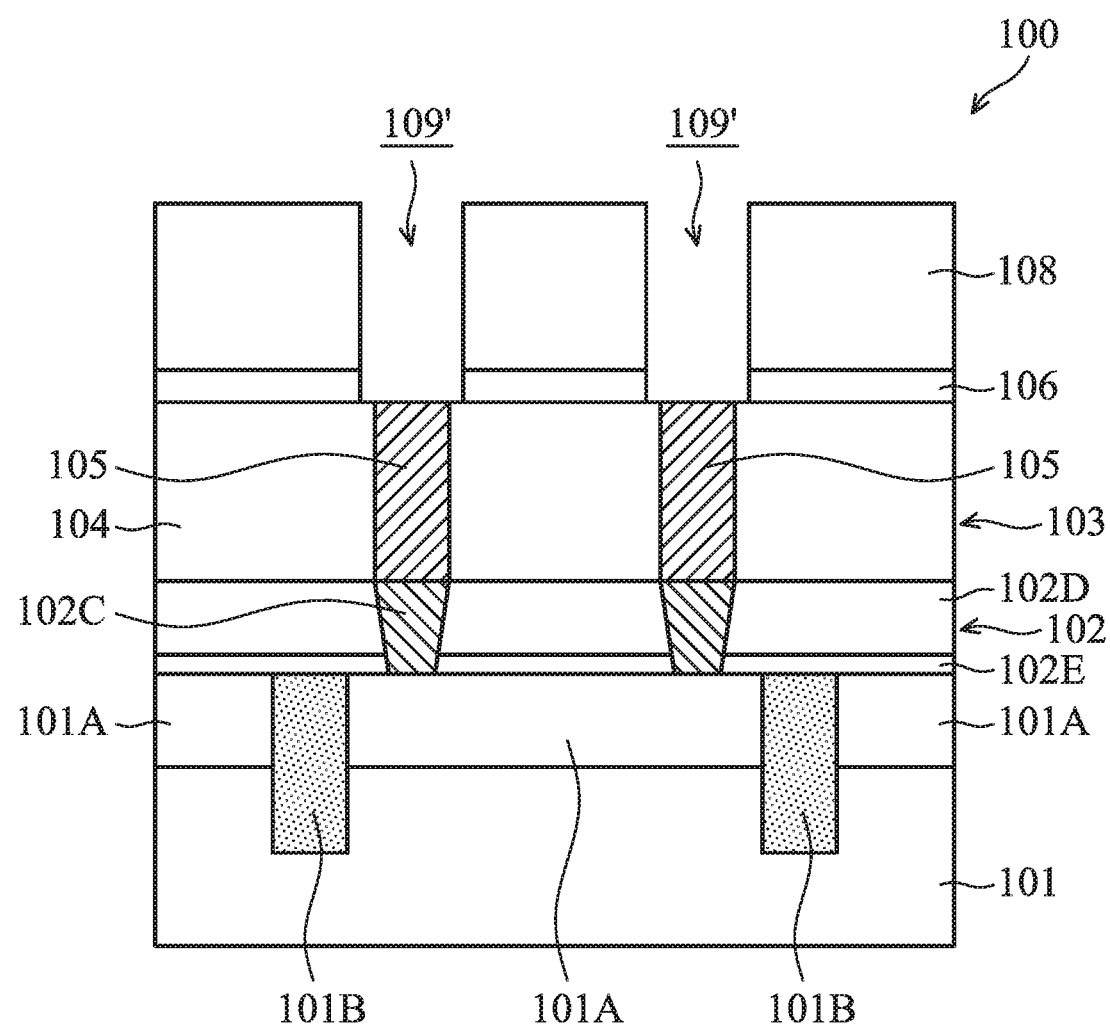
Figures 1, 1D, 2:
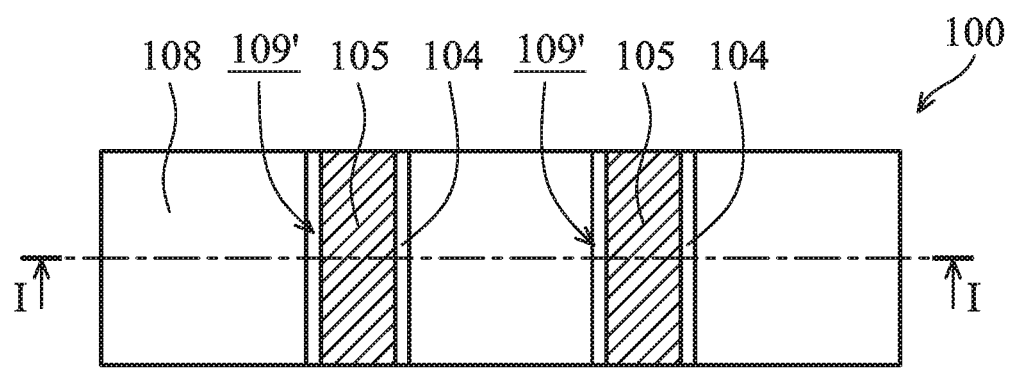

Next, the portions of the etch stop layer 106 exposed through the openings 109 of the BARC layer 108 are removed to expose portions of the metal lines 105, as shown in FIG. 1D-1 in accordance with some embodiments. Thereafter, the openings 109 of the BARC layer 108 are extended to the top surfaces of the metal lines 105 to form openings 109'. The portions of the etch stop layer 106 are removed by a dry etching process or a wet clean process. In some embodiments, the dry etching process may be reactive ion etch (RIE) using inductively coupled plasma (ICP), capacitively coupled plasma (CCP) or remote plasma. The etch gases used in the dry etching process are selected from a group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar and another suitable etch gas. In some examples, the wet clean process uses an etch solution, for example diluted hydrofluoric acid (dHF), nitric acid ($HNO_3$), phosphoric acid ($H_3PO_4$) or a combination thereof.

FIG. 1D-2 shows a top view of the structure of FIG. 1D-1 in accordance with some embodiments. The cross-sectional view of FIG. 1D-1 is taken along line I-I of FIG. 1D-2. The openings 109' in the BARC layer 108 and the etch stop layer 106 are aligned with the metal lines 105, as shown in FIG. 1D-2 in accordance with some embodiments. The openings 109' expose portions of the metal lines 105 and portions of the dielectric layer 104. The shape of the openings 109' may be a rectangle that is parallel to the metal lines 105. The opening 109' may be wider than the metal line 105 to expose portions of the dielectric layer 104. The shape and the size of the openings 109' are the same as those of the openings 109 of the BARC layer 108.

Figures 1, 1E:
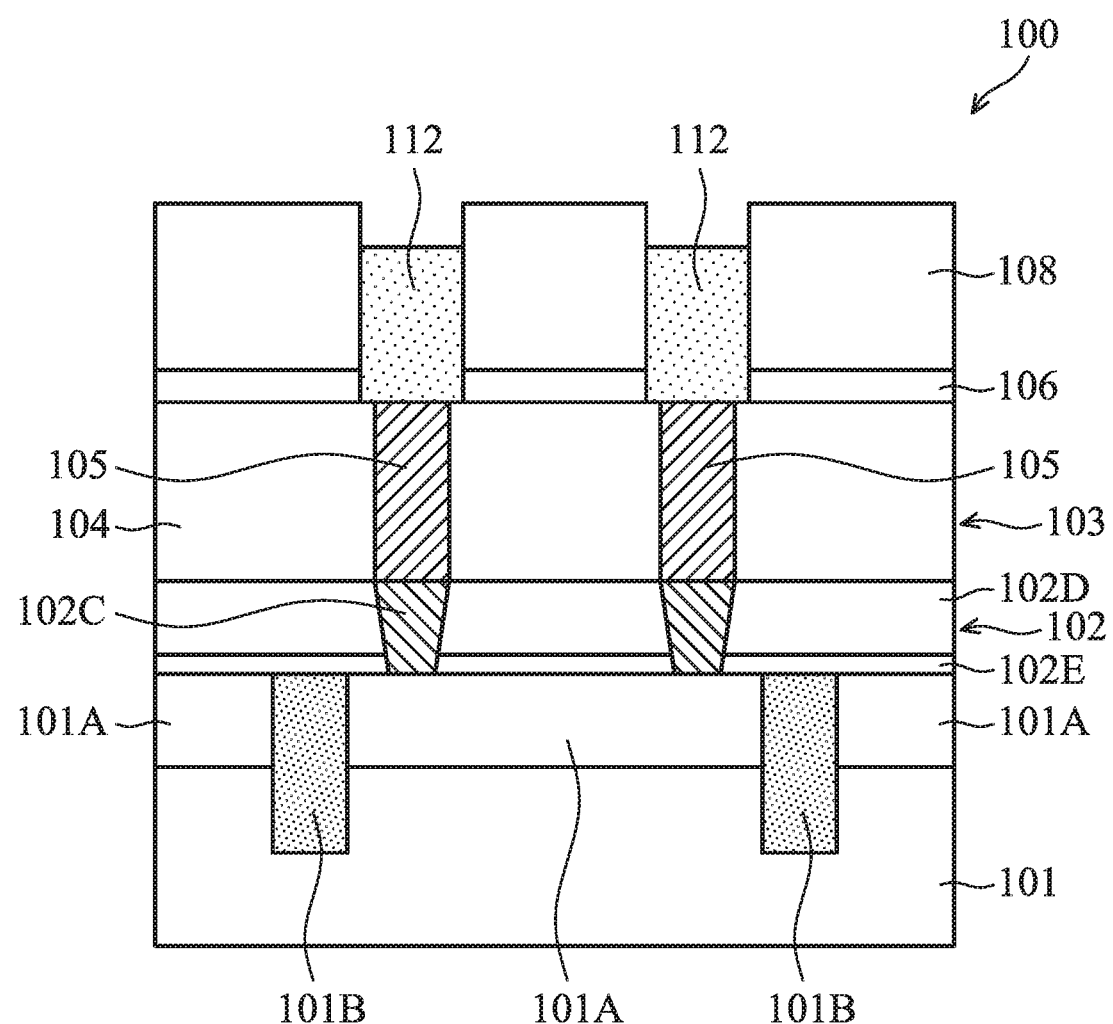
Figures 1, 1E, 2:
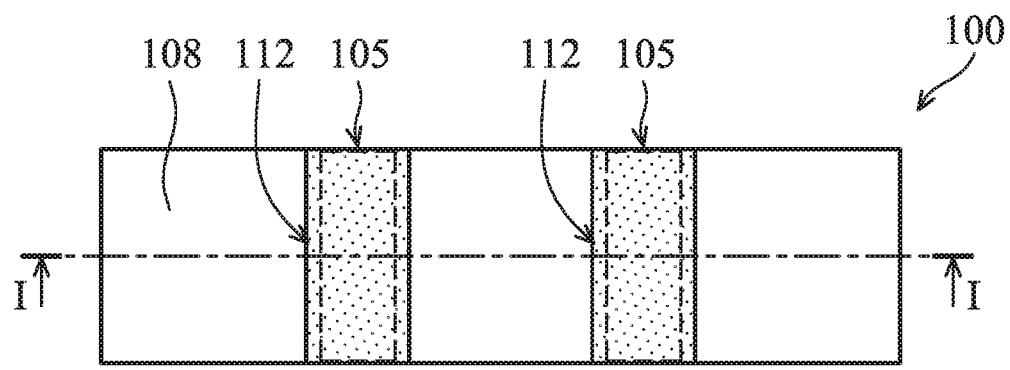

Afterwards, a dielectric film 112 is deposited in the openings 109' (FIG. 1D-1) of the BARC layer 108 and the etch stop layer 106 to be in contact with the metal lines 105, as shown in FIG. 1E-1 in accordance with some embodiments. The material of the dielectric film 112 includes silicon carbide (SiC), silicon dioxide ($SiO_2$), silicon oxycarbide (SiOC), silicon nitride (SiN), silicon carbon nitride (SiCN), silicon oxynitride (SiON), silicon carbon oxynitride (SiOCN), a low-k dielectric material (e.g., a material has a k-value lower than about 3.9) or a combination thereof. The low-k dielectric material is for example PSG, BSG, BPSG, USG, FSG, OSG, SOG, carbon doped silicon oxide, Black Diamond® (Applied Materials of Santa Clara, Calif.), Xerogel, Aerogel, amorphous fluorinated carbon, parylene, benzocyclobutene (BCB), SiLK (Dow Chemical, Midland, Mich.) or polyimide. The dielectric film 112 may be deposited at a temperature of about 30° C. to about 400° C. by spin-on coating, CVD, FCVD, PECVD, PVD, or another deposition technique. In some embodiments, the dielectric film 112 deposited in the openings 109' has a top surface that is lower than the top surface of the BARC layer 108. In some examples, the dielectric film 112 has a thickness that is in a range from about 30 Å to about 800 Å.

In some embodiments, the material layer of the dielectric film 112 is deposited on the BARC layer 108 and fills the openings 109'. The excess portion of the material layer deposited on the BARC layer 108 can be removed by a planarization process, for example a CMP process. Next, an etch back process is performed to remove a top portion of the material layer in the openings 109', such that the dielectric film 112 has a top surface that is lower than the top surface of the BARC layer 108. In some examples, the dielectric film 112 has a height that is in a range from about 30 Å to about 800 Å. The top surface of the dielectric film 112 being lower than the top surface of the BARC layer 108 can prevent the portions of the dielectric film 112 in the adjacent openings 109' from coming into contact with each other, and thereby precisely control the CD, the profile and the position of a subsequently formed conductive via.

FIG. 1E-2 shows a top view of the structure of FIG. 1E-1 in accordance with some embodiments. The cross-sectional view of FIG. 1E-1 is taken along line I-I of FIG. 1E-2. The portions of the dielectric film 112 in the openings 109' are formed on and aligned with the metal lines 105, respectively, as shown in FIG. 1E-2 in accordance with some embodiments. The shape of the portions of the dielectric film 112 in the openings 109' may be a rectangle that is parallel to the metal lines 105 and may be wider than the metal lines 105. The portions of the dielectric film 112 in the openings 109' are in contact with the metal lines 105 and portions of the dielectric layer 104 around the metal lines 105.

Figures 1, 1F:
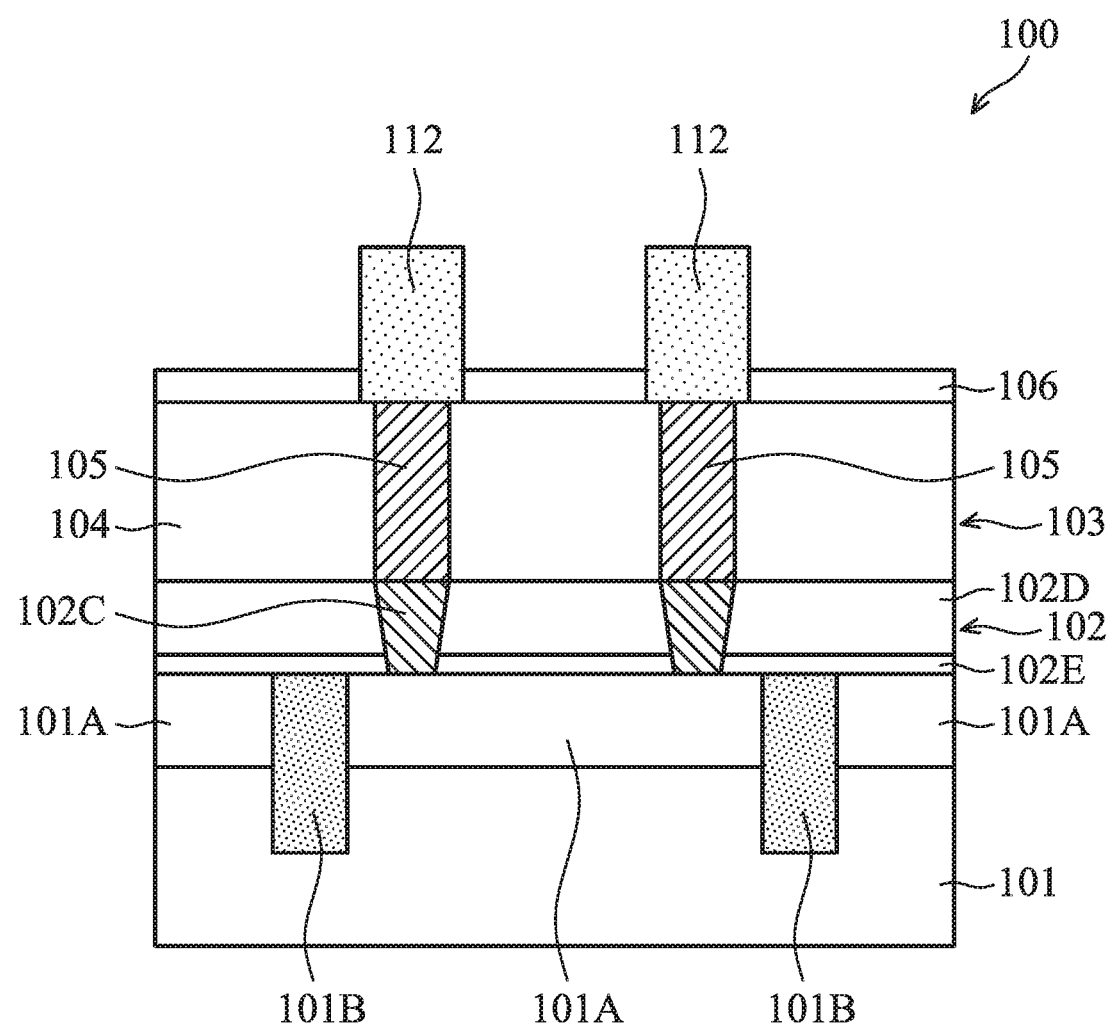
Figures 1, 1F, 2:
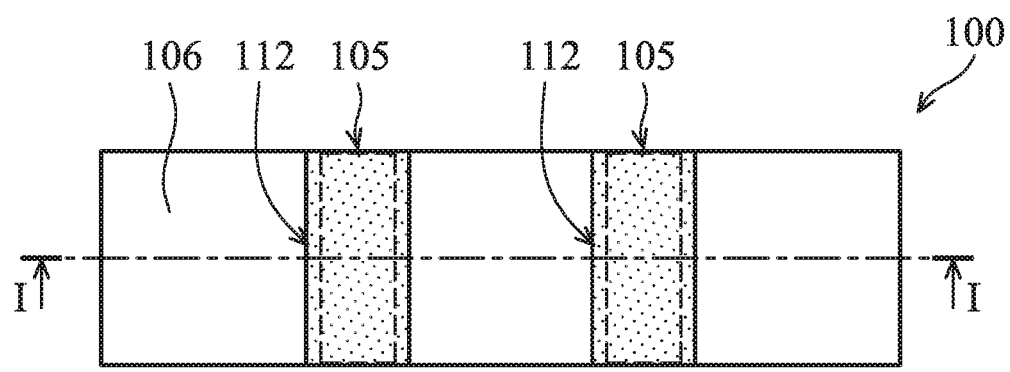

Afterwards, the BARC layer 108 is removed and the portions of the dielectric film 112 in the openings 109' are remained on the metal lines 105, as shown in FIG. 1F-1 in accordance with some embodiments. The portions of the dielectric film 112 remained on the metal lines 105 may be referred to as dielectric bumps 112. The dielectric bumps 112 pass through the etch stop layer 106 to be in contact with the metal lines 105. The BARC layer 108 is removed by a wet etching process or a dry etching process. The wet etching process is performed with etchant solution, for example acid solution of HCl, $NH_4OH$ or $H_2SO_4$ mixed with $H_2O_2$, or another suitable etchant solution. The dry etching process is performed with etch gases selected from a group consisting of $CH_4$, $CH_3F$, $CH_2F_2$, $CHF_3$, $C_4F_8$, $C_4F_6$, $CF_4$, $NF_3$, $H_2$, HBr, CO, $CO_2$, $O_2$, $BCl_3$, $Cl_2$, $SiCl_4$, $N_2$, He, Ne and Ar, or another suitable etch gas.

FIG. 1F-2 shows a top view of the structure of FIG. 1F-1 in accordance with some embodiments. The cross-sectional view of FIG. 1F-1 is taken along line I-I of FIG. 1F-2. After the BARC layer 108 is removed, the etch stop layer 106 is exposed. The dielectric bumps 112 pass through the etch stop layer 106 and cover the respective metal lines 105. The shape of the dielectric bumps 112 may be a rectangle that is parallel to the metal line 105 and may be wider than the metal line 105. The dielectric bumps 112 also cover portions of the dielectric layer 104 around the metal lines 105.

Figures 1, 1G:
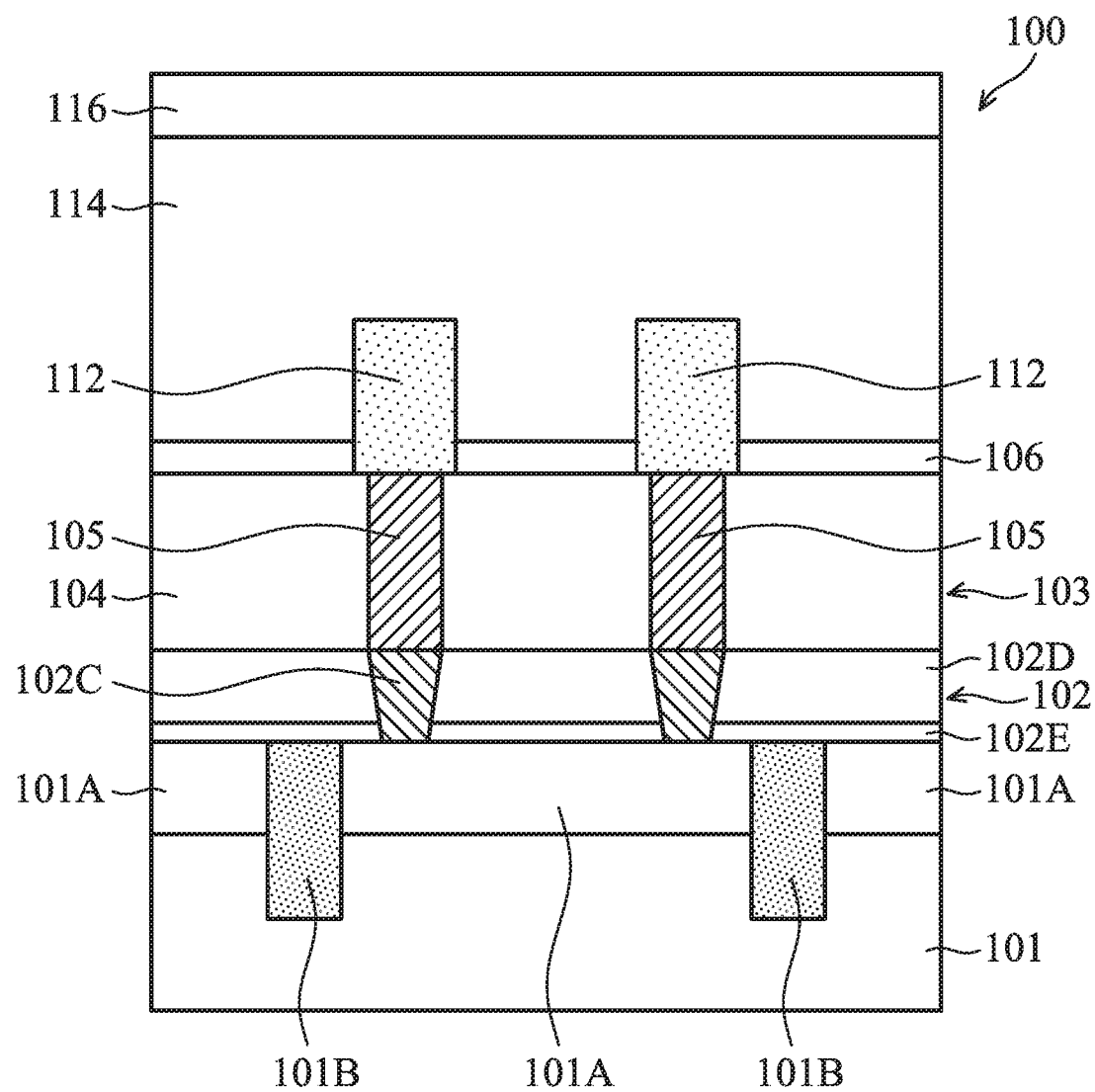
Figures 1, 1G, 2:
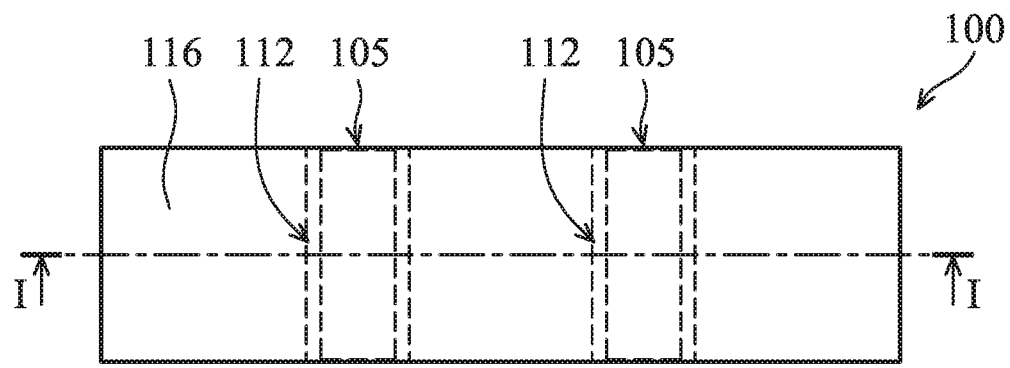

Next, a dielectric film 114 is deposited on the etch stop layer 106 to cover the dielectric bumps 112, as shown in FIG. 1G-1 in accordance with some embodiments. The material of the dielectric film 114 includes silicon carbide (SiC), silicon dioxide ($SiO_2$), silicon oxycarbide (SiOC), silicon nitride (SiN), silicon carbon nitride (SiCN), silicon oxynitride (SiON), silicon carbon oxynitride (SiOCN), a low-k dielectric material (e.g., a material has a k-value lower than about 3.9), for example PSG, BSG, BPSG, USG, FSG, OSG, SOG, spin-on-polymers or a combination thereof. According to the embodiments of the disclosure, the material of the dielectric film 114 is different from the material of the dielectric bumps 112. The dielectric bumps 112 have an etching rate that is higher than the etching rate of the dielectric film 114 in an etching process for forming a via hole. The dielectric film 114 may be deposited at a temperature of about 30° C. to about 400° C. by spin-on coating, CVD, FCVD, PECVD, PVD, or another deposition technique. In some examples, the dielectric film 114 has a thickness that is in a range from about 30 Å to about 800 Å. The thickness of the dielectric film 114 is greater than the thickness of the dielectric bumps 112.

In some embodiments, a hard mask layer 116 is deposited on the dielectric film 114. The material of the hard mask layer 116 includes metals, metal nitrides, metal oxides, metal carbides, metal carbon nitrides or another suitable material, for example Ta, TaN, TiN, ZrO, TiO, ZrTiO, HfO, $SiO_2$, SiOC, SiC, SiN, WOx, WN, WC, WCN, W or a combination thereof. The hard mask layer 116 may be deposited at a temperature of about 150° C. to about 400° C. by PVD, CVD, ALD, spin-on coating or another deposition technique. In some examples, the hard mask layer 116 has a thickness that is in a range from about 10 Å to about 1000 Å. FIG. 1G-2 shows a top view of the structure of FIG. 1G-1 in accordance with some embodiments. The cross-sectional view of FIG. 1G-1 is taken along line I-I of FIG. 1G-2. The hard mask layer 116 covers the dielectric film 114, the dielectric bumps 112 and other underlying features, as shown in FIG. 1G-2 in accordance with some embodiments.

Figures 1, 1H:
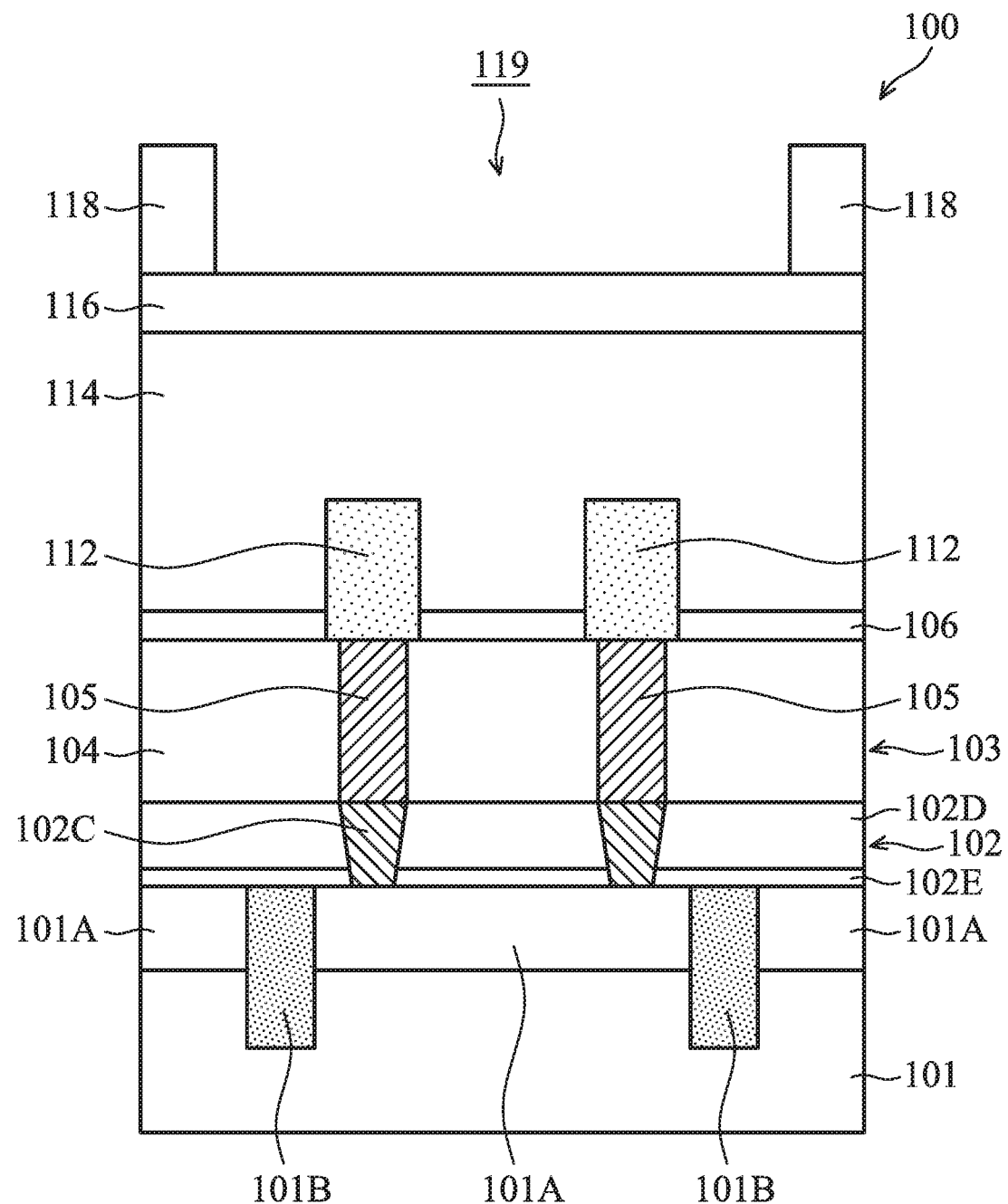
Figures 1, 1H, 2:
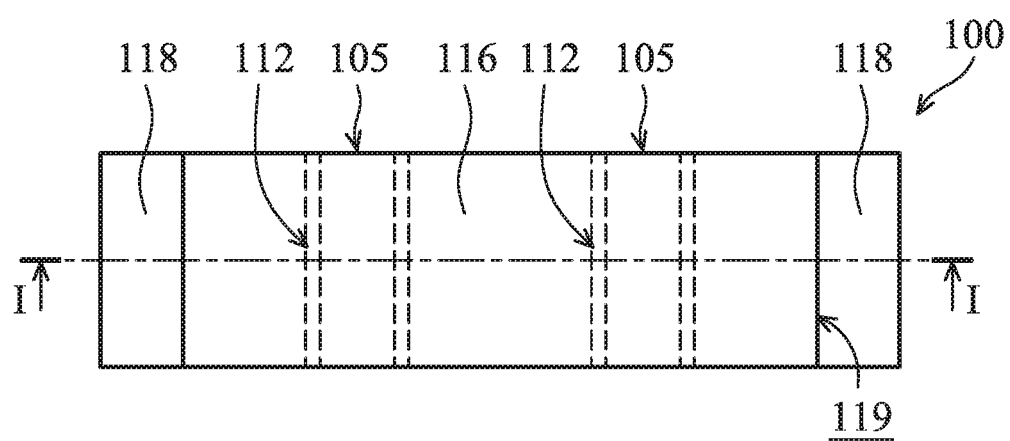

Next, a patterned photoresist layer 118 is formed on the hard mask layer 116, as shown in FIG. 1H-1 in accordance with some embodiments. The patterned photoresist layer 118 is formed using photolithography process to have an opening 119 that exposes a portion of the hard mask layer 116. FIG. 1H-2 shows a top view of the structure of FIG. 1H-1 in accordance with some embodiments. The cross-sectional view of FIG. 1H-1 is taken along line I-I of FIG. 1H-2. The shape of the opening 119 may be a rectangle that has a longitudinal direction perpendicular to the longitudinal direction of the metal lines 105, as shown in FIG. 1H-2 in accordance with some embodiments. The opening 119 of the patterned photoresist layer 118 is situated across the metal lines 105 and the dielectric bumps 112.

Figures 1, 1I:
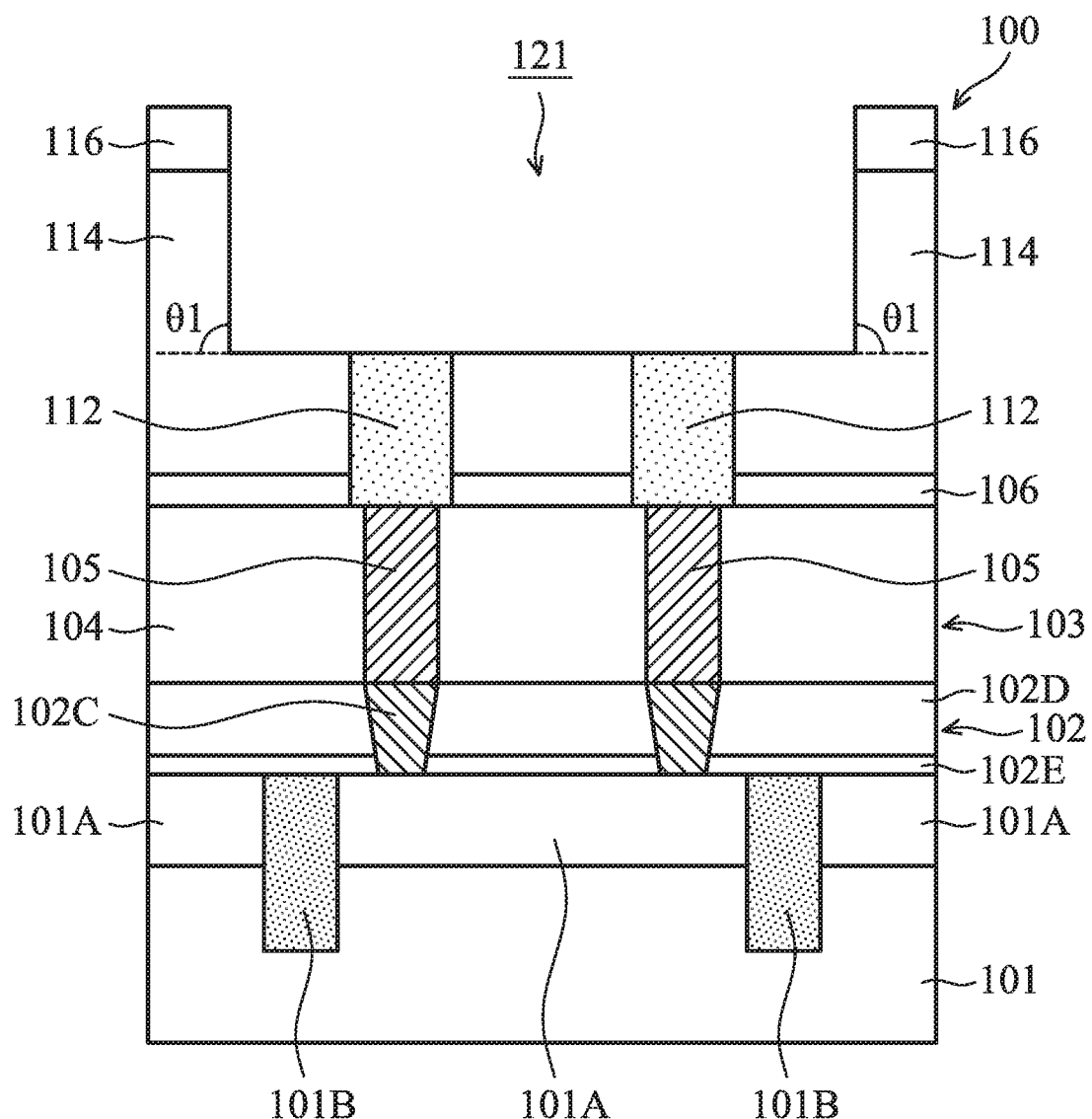
Figures 1, 1I, 2:
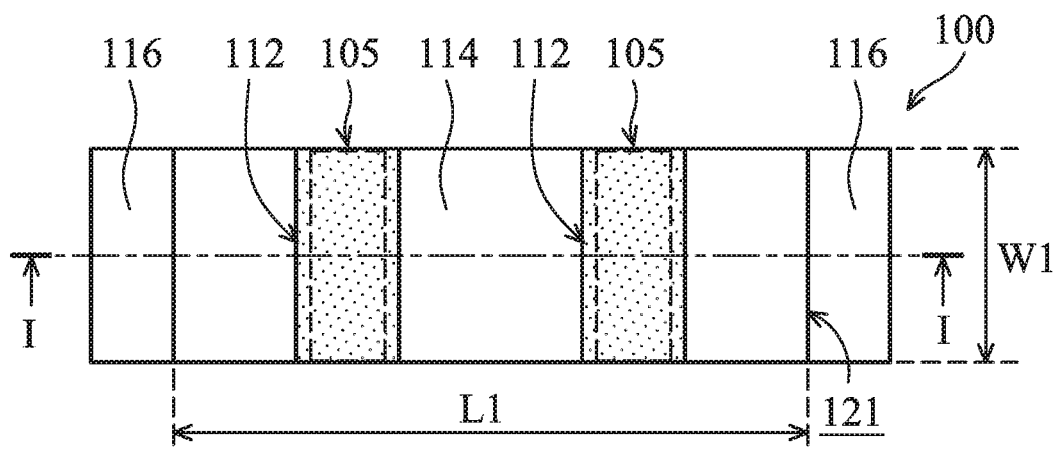

Afterwards, the hard mask layer 116 and the dielectric film 114 are etched using the patterned photoresist layer 118 as an etch mask in an etching process to form a trench 121 in the hard mask layer 116 and the dielectric film 114, as shown in FIG. 1I-1 in accordance with some embodiments. The etching process is anisotropic and is a dry etching process for example reactive ion etch (RIE) using inductively coupled plasma (ICP) or capacitively coupled plasma (CCP). The etch gases used in the dry etching process are selected from a group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar and another suitable etch gas. The dry etching process may be performed with a pressure of about 0.2 mTorr to about 120 mTorr, a temperature of about 0° C. to about 100° C., a power of about 50 W to about 3000 W, and a bias of about 0V to about 1200V. After the trench 121 is formed in the dielectric film 114 to expose the top surfaces of the dielectric bumps 112, the etching process is stopped on the dielectric bumps 112. Subsequently, the patterned photoresist layer 118 is removed in an ashing process or a wet strip process, for example. The hard mask layer 116 can protect the dielectric film 114 during the process of removing the patterned photoresist layer 118.

There is an angle $\theta1$ between the sidewall of the trench 121 and the extending horizontal plane of the bottom surface of the trench 121 at the side of the dielectric film 114, as shown in FIG. 1I-1 in accordance with some embodiments. In some examples, the angle $\theta1$ is in a range from about 50 degrees to about 90 degrees. FIG. 1I-2 shows a top view of the structure of FIG. 1I-1 in accordance with some embodiments. The cross-sectional view of FIG. 1I-1 is taken along line I-I of FIG. 1I-2. The dielectric bumps 112 are exposed through the trench 121, as shown in FIG. 1I-2 in accordance with some embodiments. The shape of the trench 121 may be a rectangle that has a longitudinal direction perpendicular to the longitudinal direction of the metal lines 105. In some examples, the trench 121 has a top width W1 that is in a range from about 10 nm to about 300 nm. In addition, the trench 121 has a top length L1 that is in a range from about 600 nm to about 1200 nm. While the angle $\theta1$ is smaller than 90 degrees, the top length L1 of the trench 121 is larger than the bottom length of the trench 121. Also, the top width W1 of the trench 121 is larger than the bottom width of the trench 121.

Figures 1, 1J:
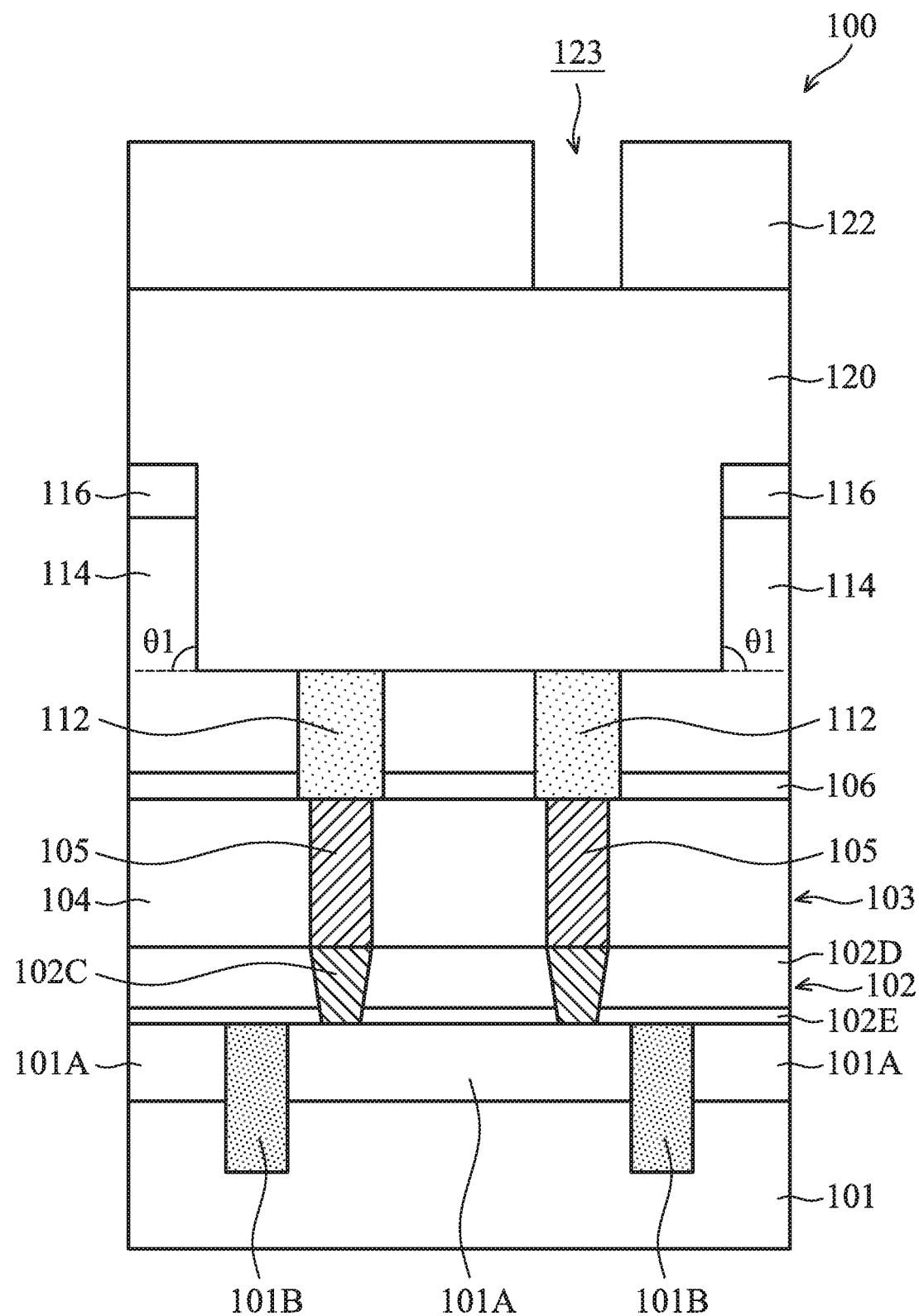
Figures 1, 1J, 2:
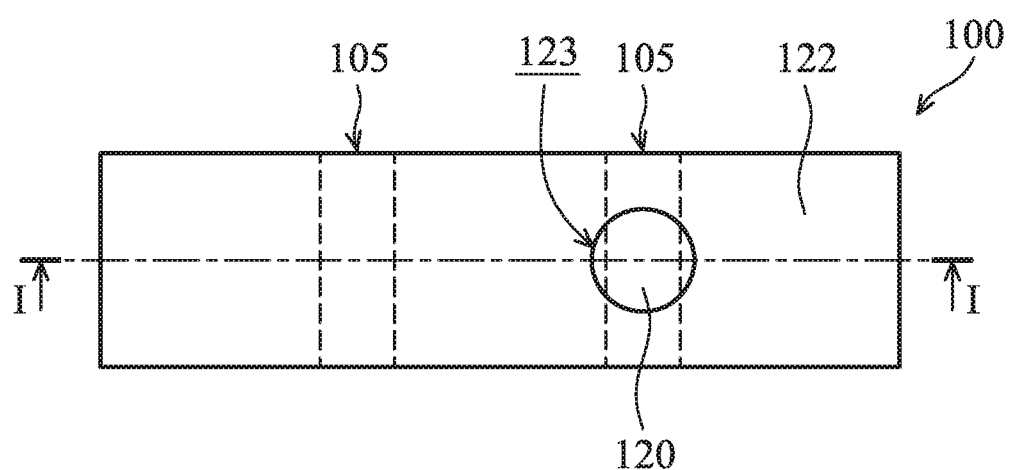

Afterwards, a BARC layer 120 is deposited on the hard mask layer 116 and fills the trench 121, as shown in FIG. 1J-1 in accordance with some embodiments. The material and process for forming the BARC layer 120 may be the same as or similar to those for forming the BARC layer 108. Next, a patterned photoresist layer 122 is formed on the BARC layer 120 as shown in FIG. 1J-1 in accordance with some embodiments. The patterned photoresist layer 122 is formed using photolithography process to have an opening 123 to expose a portion of the BARC layer 120. FIG. 1J-2 shows a top view of the structure of FIG. 1J-1 in accordance with some embodiments. The cross-sectional view of FIG. 1J-1 is taken along line I-I of FIG. 1J-2. The shape of the opening 123 may be a circle, an ellipse, a square, a rectangle, a polygon or another shape, and may be wider than the metal line 105. In some embodiments, the patterned photoresist layer 122 has one opening 123 that is situated on one of the dielectric bumps 112 over one of the metal lines 105 for forming one via hole. In some embodiments, the patterned photoresist layer 122 has multiple openings 123 that are situated on the respective dielectric bumps 112 over the respective metal lines 105 for forming multiple via holes.

Figures 1, 1K:
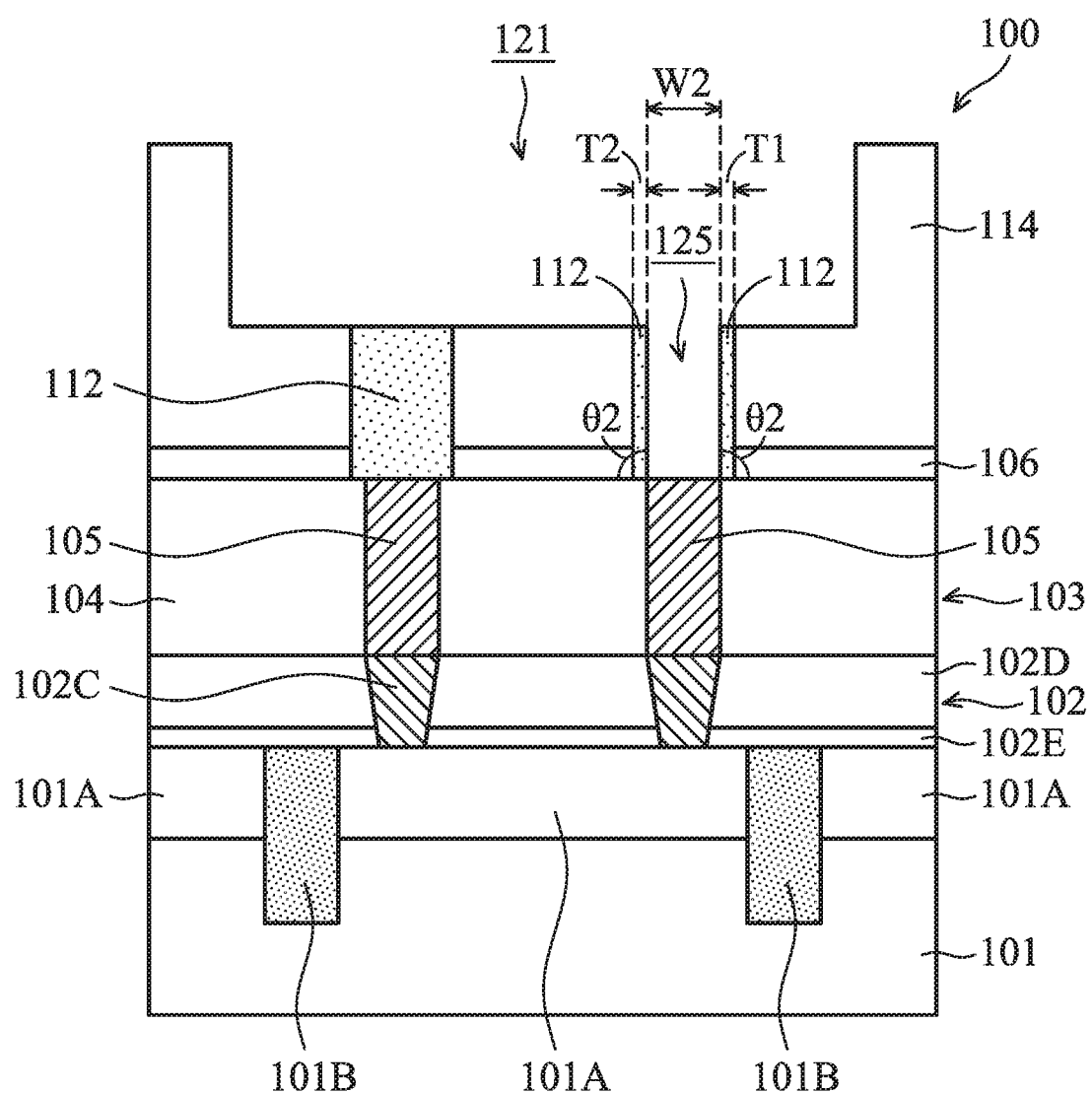
Figures 1, 1K, 2:
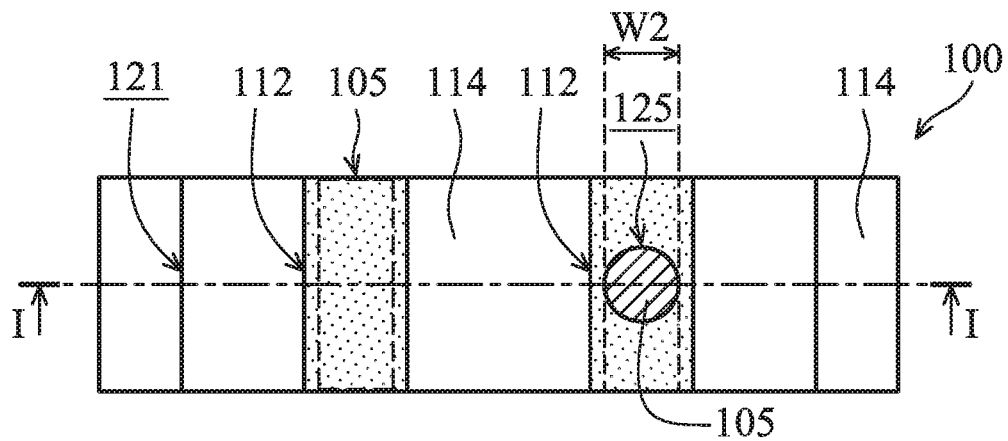

Afterwards, the BARC layer 120 and the dielectric bump 112 are etched using the patterned photoresist layer 122 as an etch mask in an etching process to form a via hole 125 in the dielectric film 114 and surrounded by the remaining portion of the dielectric bump 112, as shown in FIG. 1K-1 in accordance with some embodiments. The etching process is anisotropic and is a dry etching process for example reactive ion etch (RIE) using inductively coupled plasma (ICP) or capacitively coupled plasma (CCP). The etch gases used in the dry etching process are selected from a group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar and another suitable etch gas. The dry etching process may be performed with a pressure of about 0.2 mTorr to about 120 mTorr, a temperature of about 0° C. to about 100° C., a power of about 50 W to about 3000 W, and a bias of about 0V to about 1200V.

In the etching process of forming the via hole 125, the dielectric bump 112 has an etching rate that is higher than the etching rate of the dielectric film 114. In some embodiments, an etching selectivity of the dielectric bump 112 to the dielectric film 114 is in a range from about 6 to about 20. In some instances, the etching selectivity of the dielectric bump 112 to the dielectric film 114 is greater than 6 and up to about 20. Therefore, the portion of the dielectric film 114 around the dielectric bump 112 is not damaged by the etching process. According to the embodiments of the disclosure, the via hole 125 is formed by etching the dielectric bump 112, which can be referred to as self-aligned via hole etching. Moreover, a conductive via is subsequently formed in the via hole 125 and can avoid top rounding, overlay shift and enlarged critical dimension (CD) issues.

There is an angle $\theta2$ between the sidewall of the via hole 125 and the bottom surface of the remaining portion of the dielectric bump 112 or the bottom surface of the etch stop layer 106, as shown in FIG. 1K-1 in accordance with some embodiments. In some examples, the angle $\theta2$ is in a range from about 40 degrees to about 90 degrees. FIG. 1K-2 shows a top view of the structure of FIG. 1K-1 in accordance with some embodiments. The cross-sectional view of FIG. 1K-1 is taken along line I-I of FIG. 1K-2. A portion of the metal line 105 is exposed through the via hole 125, as shown in FIG. 1K-2 in accordance with some embodiments. The shape of the via hole 125 may be a circle, an ellipse, a square, a rectangle, a polygon or another shape, and may be wider than the metal line 105. In some examples, the via hole 125 has a top width W2 that is in a range from about 5 nm to about 300 nm. While the angle $\theta2$ is smaller than 90 degrees, the top width W2 of the via hole 125 is larger than the bottom width of the via hole 125.

In some embodiments, the remaining portion of the dielectric bump 112 surrounds the via hole 125. The remaining portion of the dielectric bump 112 between the via hole 125 and the right dielectric film 114 has a thickness T1. The remaining portion of the dielectric bump 112 between the via hole 125 and the left dielectric film 114 has a thickness T2. In some examples, the thickness T1 and the thickness T2 are in a range from 0 nm to about 10 nm. In some instances, the thickness T1 is almost equal to the thickness T2. In some instances, the thickness T1 is different from the thickness T2. For example, the thickness T1 is about 0 nm and the thickness T2 is greater than 0 nm and may reach about 10 nm. Alternatively, the thickness T2 is about 0 nm and the thickness T1 is greater than 0 nm and may reach about 10 nm.

After the via hole 125 is formed, the BARC layer 120 and the patterned photoresist layer 122 are removed in an ashing process or a wet strip process to expose the trench 121 in the dielectric film 114, as shown in FIG. 1K-1 in accordance with some embodiments. The hard mask layer 116 can protect the dielectric film 114 during the process of removing the BARC layer 120 and the patterned photoresist layer 122. In some instances, the hard mask layer 116 is also removed after the BARC layer 120 and the patterned photoresist layer 122 are removed. In some instances, the hard mask layer 116 is left on the dielectric film 114. In some embodiments, the left dielectric bump 112 is not etched since the opening 123 of the patterned photoresist layer 122 is not aligned with the left dielectric bump 112. Thereafter, the top surface of the left dielectric bump 112 is exposed through the trench 121.

Figures 1, 1L:
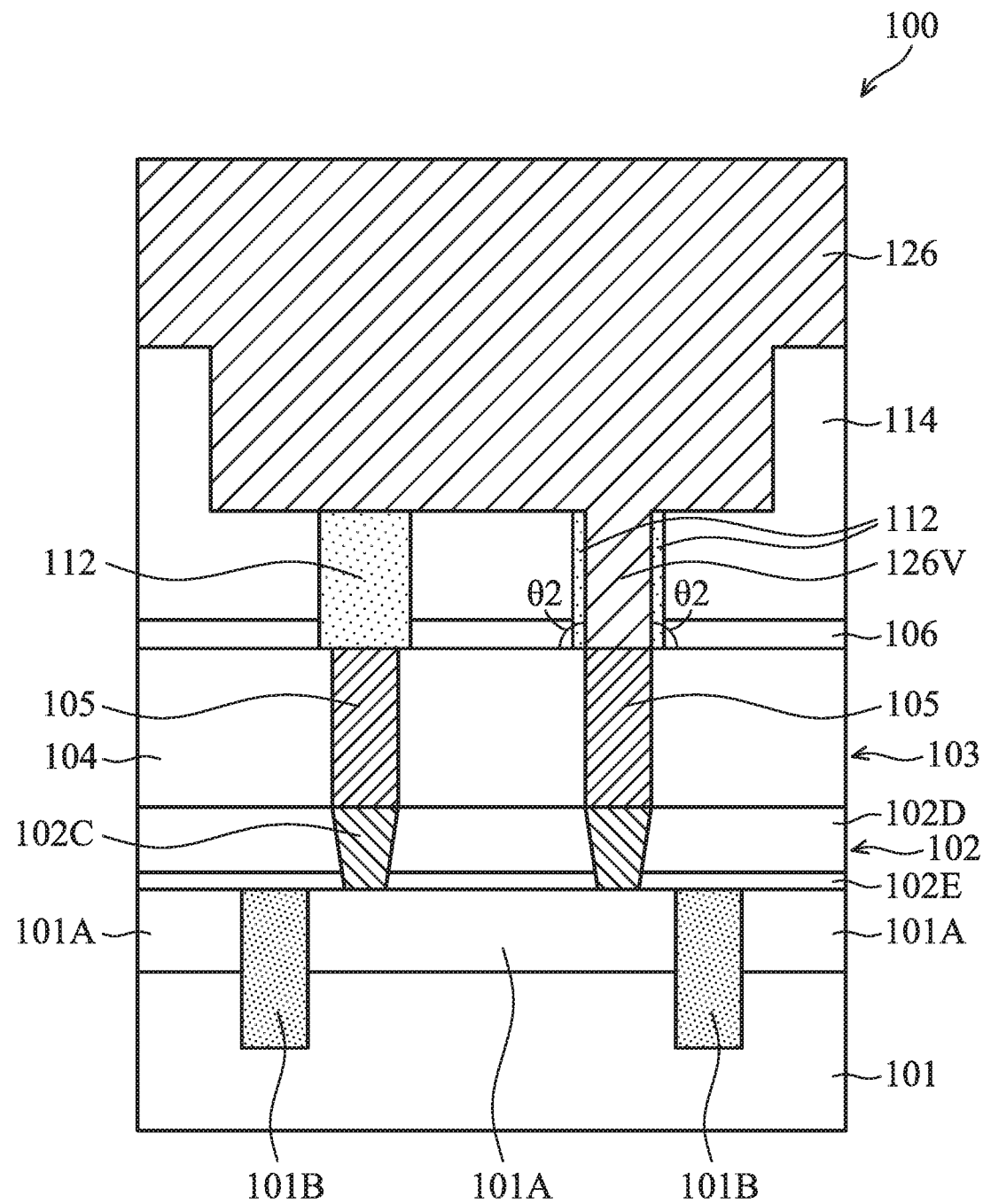
Figures 1, 1L, 2:
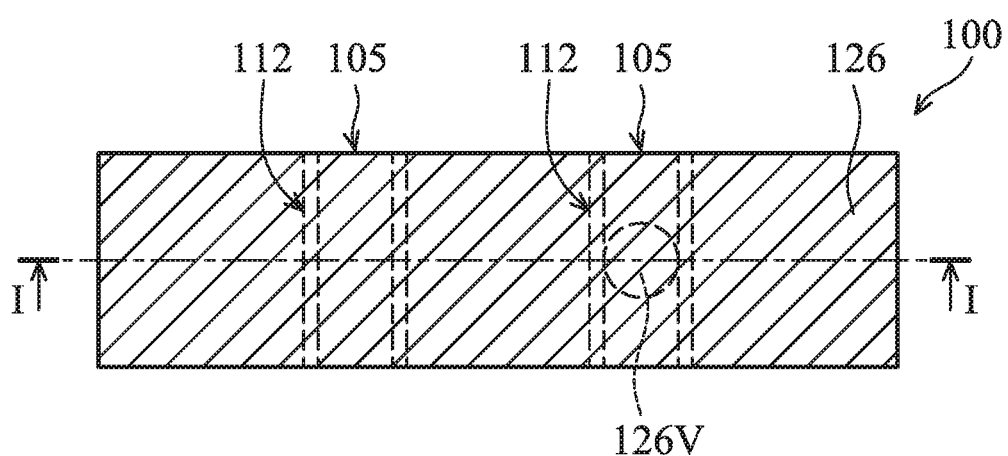

Afterwards, a conductive material 126 is deposited on the dielectric film 114 and fills the trench 121 and the via hole 125, as shown in FIG. 1L-1 in accordance with some embodiments. The portions of the conductive material 126 in the trench 121 and the via hole 125 are connected together to be an integrated structure. The conductive material 126 includes Ta, TaN, TiN, Cu, Co, Ru, Mo, W or a combination thereof. The conductive material 126 may be deposited using PVD, CVD, ALD, ECP, ELD or a spin-on coating process at a temperature of about 150° C. to about 400° C. FIG. 1L-2 shows a top view of the structure of FIG. 1L-1 in accordance with some embodiments. The cross-sectional view of FIG. 1L-1 is taken along line I-I of FIG. 1L-2. The conductive material 126 covers the dielectric film 114, the left dielectric bump 112 and the metal lines 105, as shown in FIG. 1L-2 in accordance with some embodiments.

Figures 1, 1M:
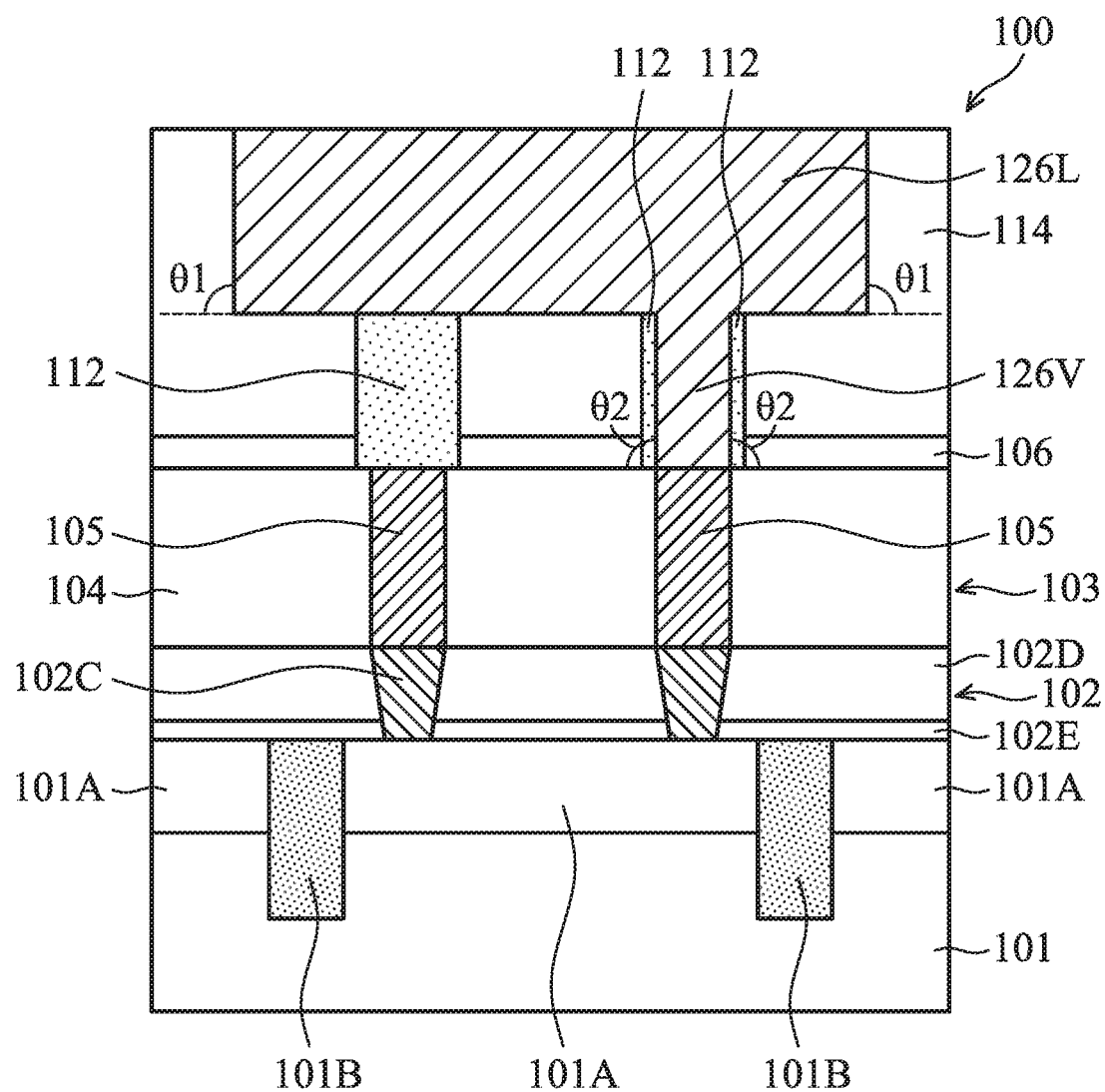
Figures 1, 1M, 2:
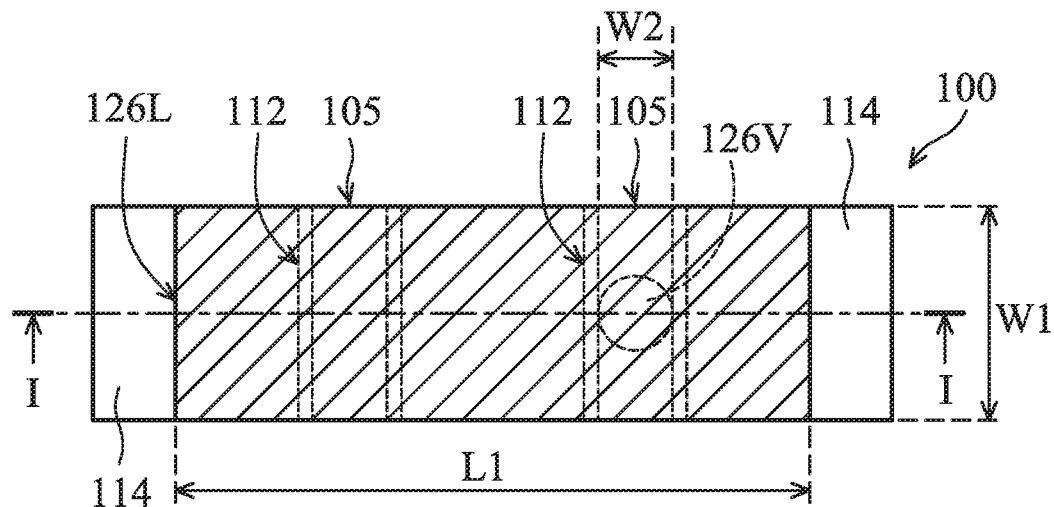
Figures 1, 1N:
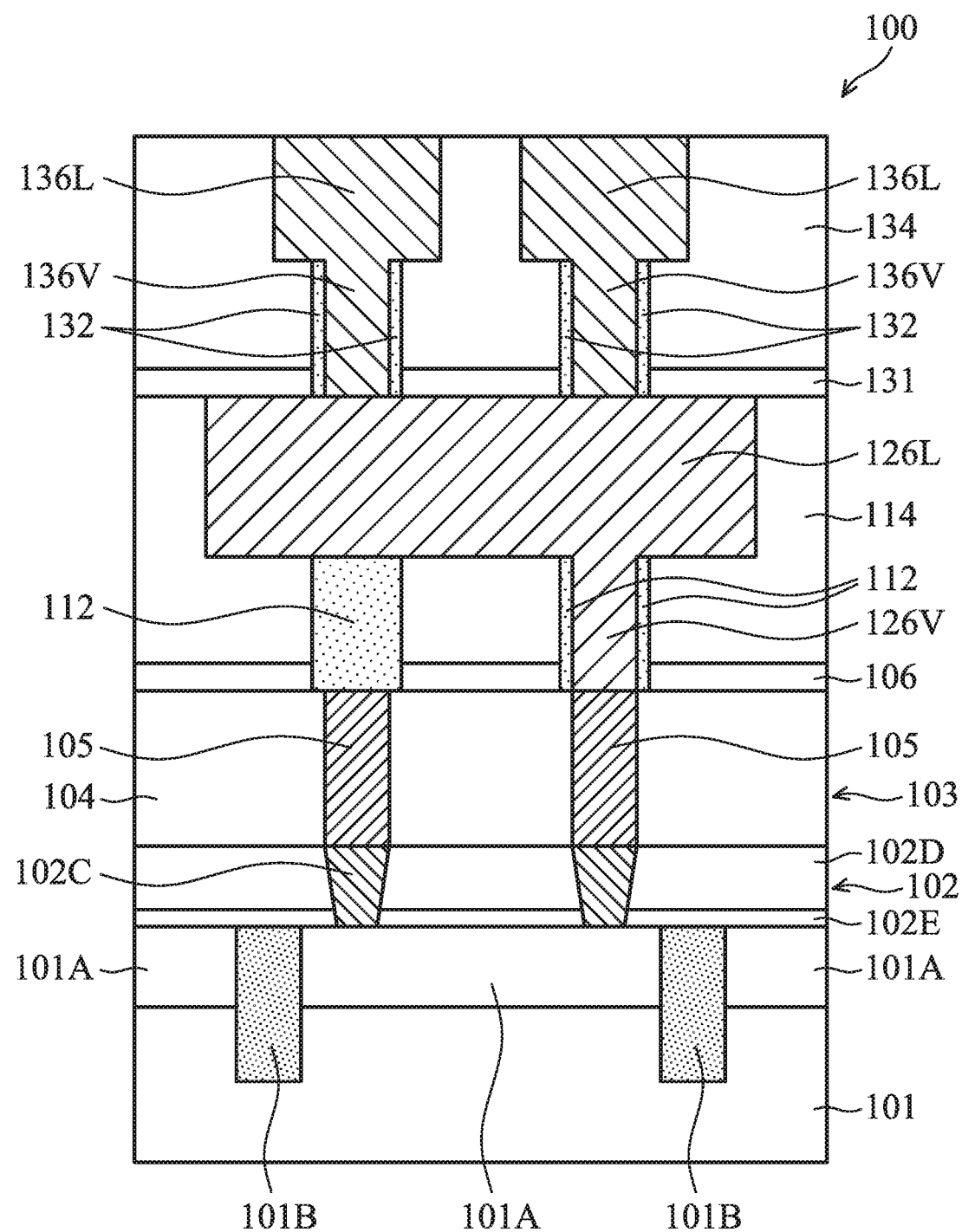
Figures 1, 1N, 2:
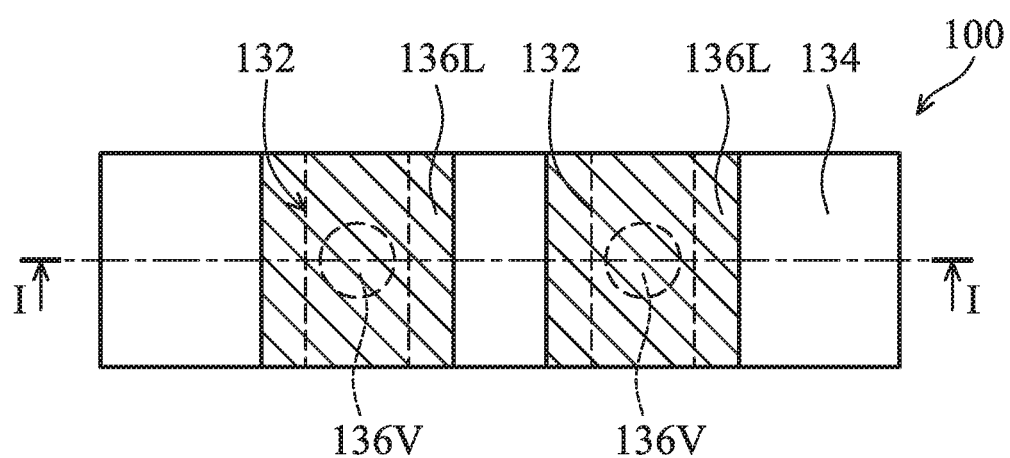

Next, the excess portion of the conductive material 126 on the dielectric film 114 is removed by a planarization process, for example a CMP process, to form a conductive line 126L and a conductive via 126V under the conductive line 126L, as shown in FIG. 1M-1 in accordance with some embodiments. The conductive line 126L has a top surface that is coplanar with the top surface of the dielectric film 114. In some instances, the hard mask layer 116 is left on the dielectric film 114 and under the conductive material 126. The remaining hard mask layer 116 is removed in the CMP process. The bottom of the conductive line 126L is connected to and in contact with the conductive via 126V. The conductive line 126L is electrically coupled to the metal line 105 through the conductive via 126V. In addition, the conductive line 126L, the conductive via 126V and the left dielectric bump 112 are embedded in the dielectric film 114. In some examples, the thickness of the conductive line 126L is in a range from about 10 Å to about 1000 Å. The thickness of the conductive via 126V is in a range from about 10 Å to about 1000 Å. There is an angle θ1 between the sidewall of the conductive line 126L and the extending horizontal plane of the bottom surface of the conductive line 126L at the side of the dielectric film 114. In some examples, the angle θ1 is in a range from about 50 degrees to about 90 degrees. There is an angle θ2 between the sidewall of the conductive via 126V and the bottom surface of the remaining portion of the dielectric bump 112 or the bottom surface of the etch stop layer 106. In some examples, the angle θ1 is in a range from about 40 degrees to about 90 degrees.

In addition, the remaining portion of the dielectric bump 112 surrounds the conductive via 126V. In some embodiments, the thickness T1 of the remaining portion of the dielectric bump 112 on the right sidewall of the conductive via 126V is almost equal to the thickness T2 of the remaining portion of the dielectric bump 112 on the left sidewall of the conductive via 126V. In some embodiments, the thickness T1 is different from the thickness T2. In some examples, the thickness T1 and the thickness T2 are in a range from 0 nm to about 10 nm. In some instances, there is no portion of the dielectric bump 112 remaining on the left or right sidewall of the conductive via 126V.

FIG. 1M-2 shows a top view of the structure of FIG. 1M-1 in accordance with some embodiments. The cross-sectional view of FIG. 1M-1 is taken along line I-I of FIG. 1M-2. The conductive line 126L has a longitudinal direction perpendicular to the longitudinal direction of the metal lines 105. In some examples, the conductive line 126L has a top width W1 that is in a range from about 10 nm to about 300 nm. In addition, the conductive line 126L has a top length L1 that is in a range from about 600 nm to about 1200 nm. While the angle θ1 is smaller than 90 degrees, the top width W1 and the top length L1 of the conductive line 126L is larger than the bottom width and the bottom length of the conductive line 126L. The conductive line 126L may have an inverted trapezoid cross-section. In some examples, the conductive via 126V has a top width W2 that is in a range from about 5 nm to about 300 nm. While the angle θ2 is smaller than 90 degrees, the top width W2 of the conductive via 126V is larger than the bottom width of the conductive via 126V. The conductive via 126V may have an inverted trapezoid cross-section. The conductive line 126L and the conductive via 126V embedded in the dielectric film 114 may be referred to as an interconnect layer of the interconnect structure for the integrated circuit device 100.

Furthermore, an upper interconnect layer 130 is formed on the conductive line 126L, as shown in FIG. 1N-1 in accordance with some embodiments. The upper interconnect layer 130 includes an etch stop layer 131 that is deposited on the conductive line 126L and the dielectric film 114. The material and process of forming the etch stop layer 131 may be the same as or similar to those described above with respect to the etch stop layer 106 of FIG. 1A-1. In some embodiments, the upper interconnect layer 130 also includes multiple conductive vias 136V on the conductive line 126L, and multiple conductive lines 136L on the respective conductive vias 136V. The conductive vias 136V and the conductive lines 136L are embedded in a dielectric film 134. The conductive vias 136V pass through the etch stop layer 131 to be in contact with the conductive line 126L. The material and process of forming the dielectric film 134, the conductive vias 136V and the conductive lines 136L may be the same as or similar to those described above with respect to the dielectric film 114, the conductive via 126V and the conductive line 126L of FIG. 1B-1 to FIG. 1M-1.

In addition, each of the conductive vias 136V is surrounded by the remaining portion of a dielectric bump 132. The material and process of forming the dielectric bumps 132 may be the same as or similar to those described above with respect to the dielectric bumps 112 of FIG. 1B-1 to FIG. 1F-1. The thickness of the remaining portion of the dielectric bump 132 on the right sidewall of the conductive via 136V may be the same as or different than that on the left sidewall of the conductive via 136V. In some examples, the thickness of the remaining portion of the dielectric bump 132 on the sidewalls of the conductive via 136V is in a range from 0 nm to about 10 nm. As mentioned in the description above, the remaining portions of the dielectric bumps 132 are created by self-aligned via hole etching. The conductive vias 136V formed in the via holes created by self-aligned via hole etching can avoid via top rounding, via overlay shift and enlarged CD issues.

FIG. 1N-2 shows a top view of the structure of FIG. 1N-1 in accordance with some embodiments. The cross-sectional view of FIG. 1N-1 is taken along line I-I of FIG. 1N-2. The conductive lines 136L have a longitudinal direction parallel to the longitudinal direction of the metal lines 105. In addition, the longitudinal direction of the conductive lines 136L is perpendicular to the longitudinal direction of the conductive line 126L. Although the integrated circuit device 100 of FIG. 1N-1 shows one upper interconnect layer 130, there may be one or more upper interconnect layer 130, one or more interconnect layer with structure formed by a dual damascene process, or a combination thereof stacked with the lower interconnect layer having the conductive via 126V to constitute an interconnect structure for the integrated circuit device 100.

Figures 1, 2A:
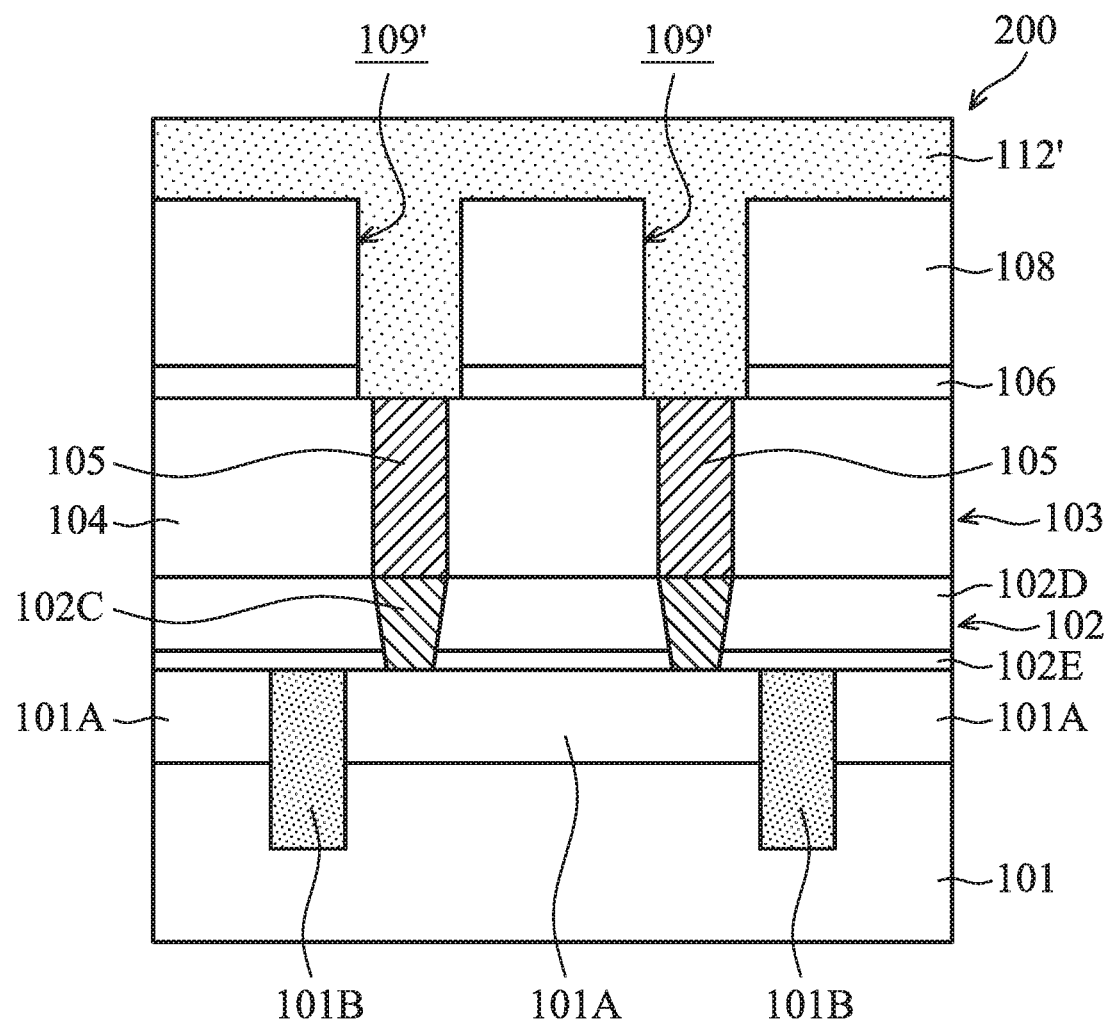
Figures 2, 2A:
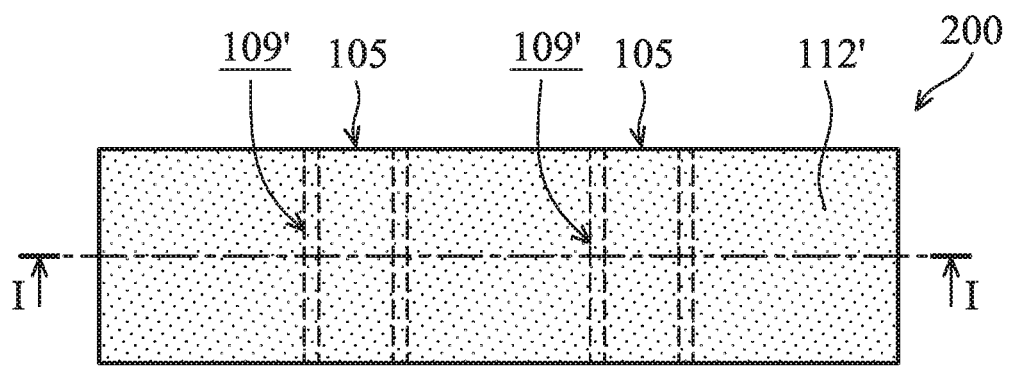
Figures 1, 2B:
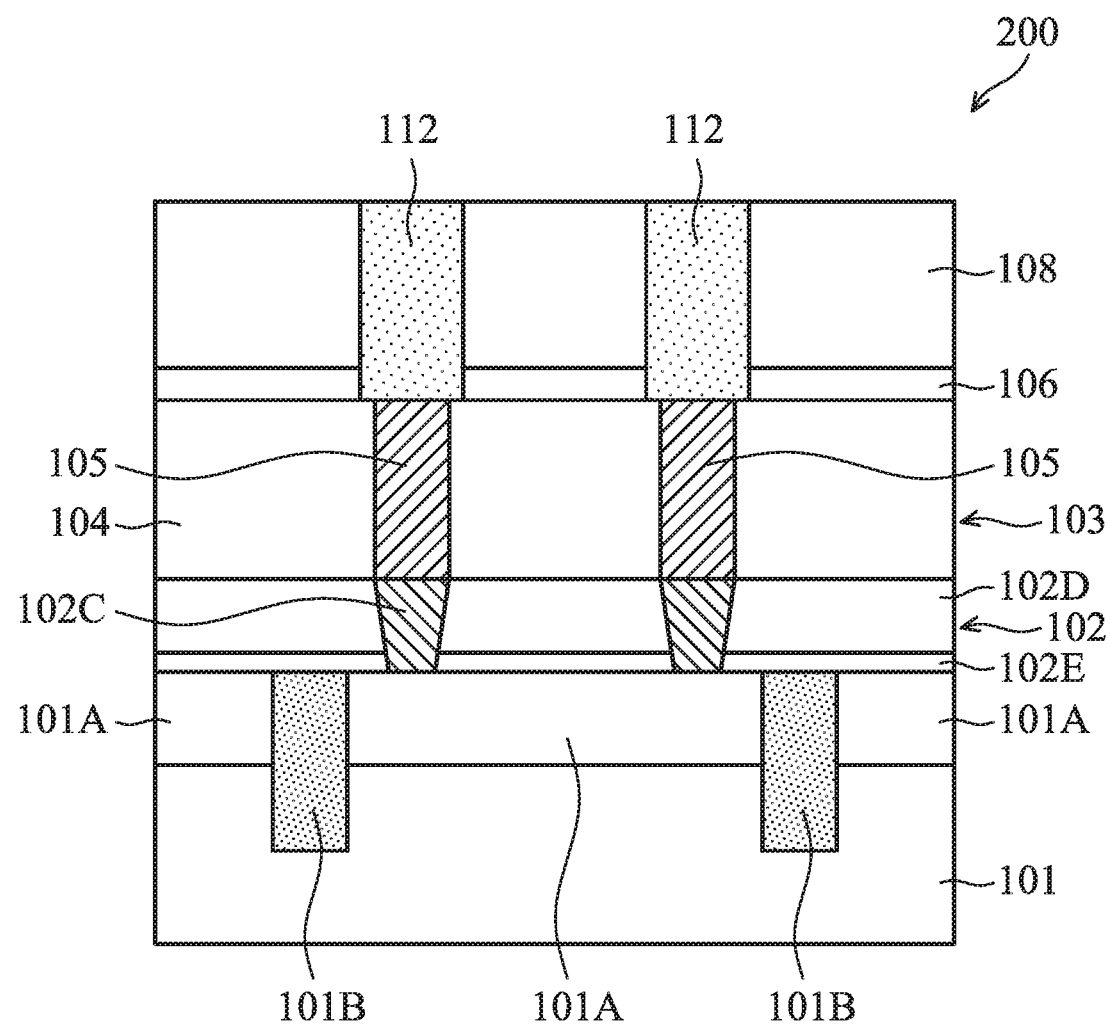
Figures 2, 2B:
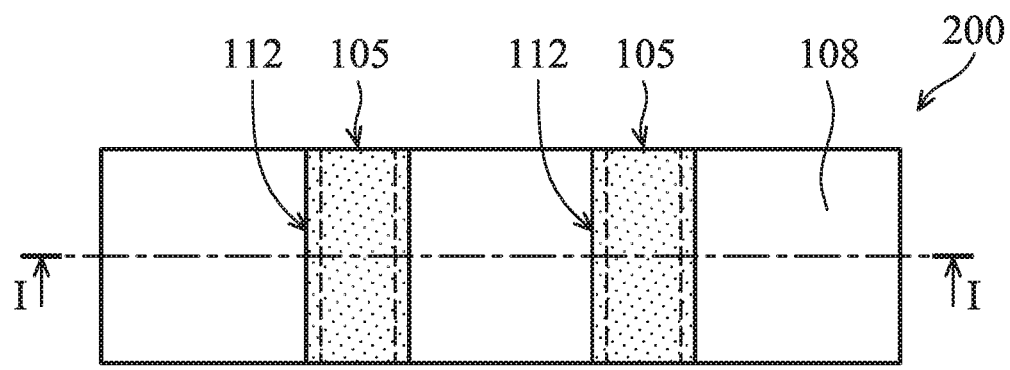
Figures 1, 2C:
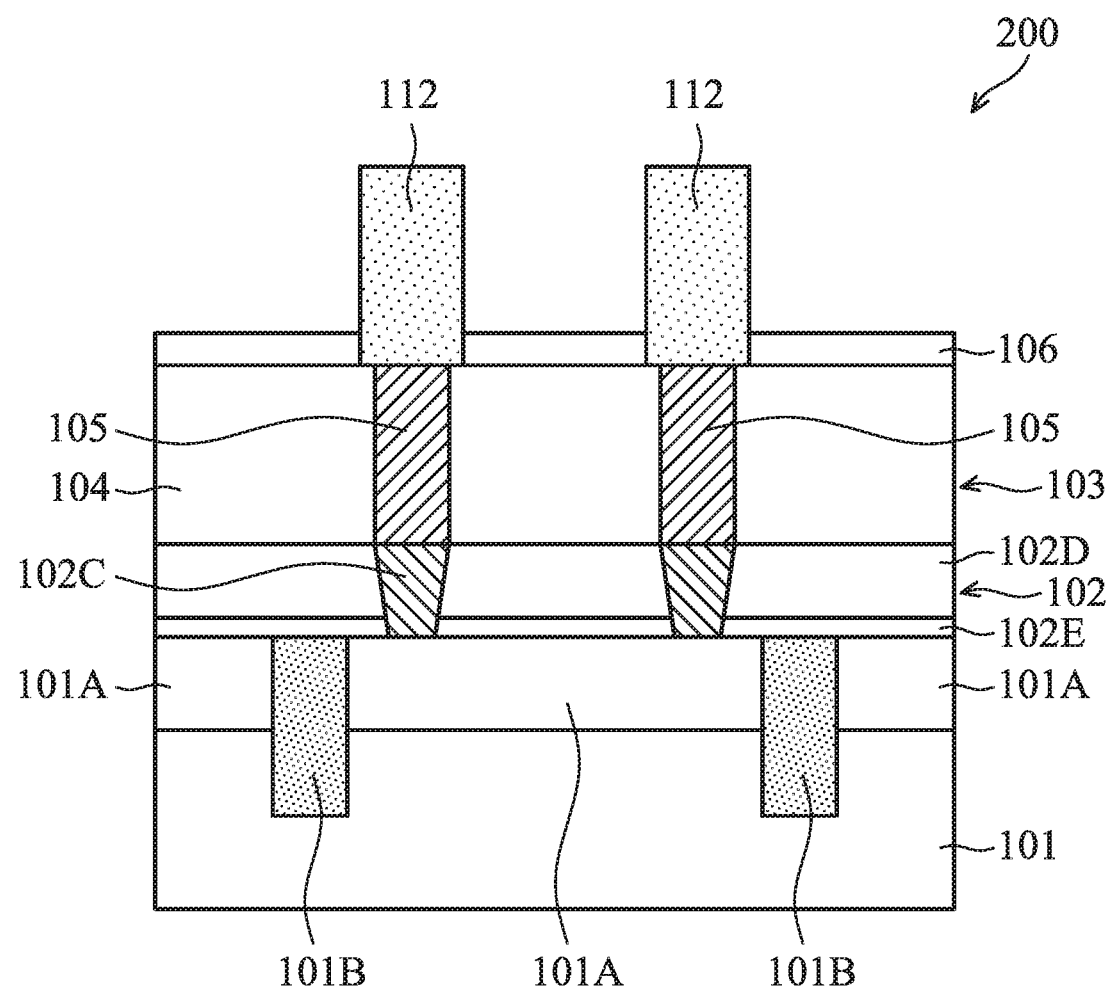
Figures 2, 2C:
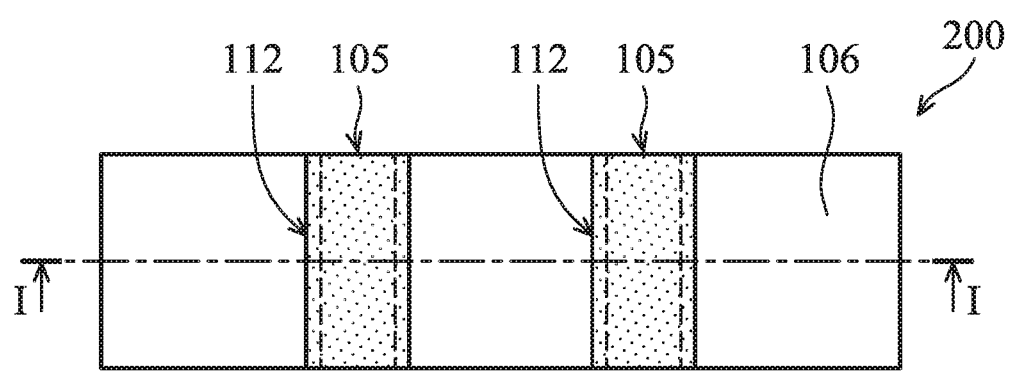
Figures 1, 2D:
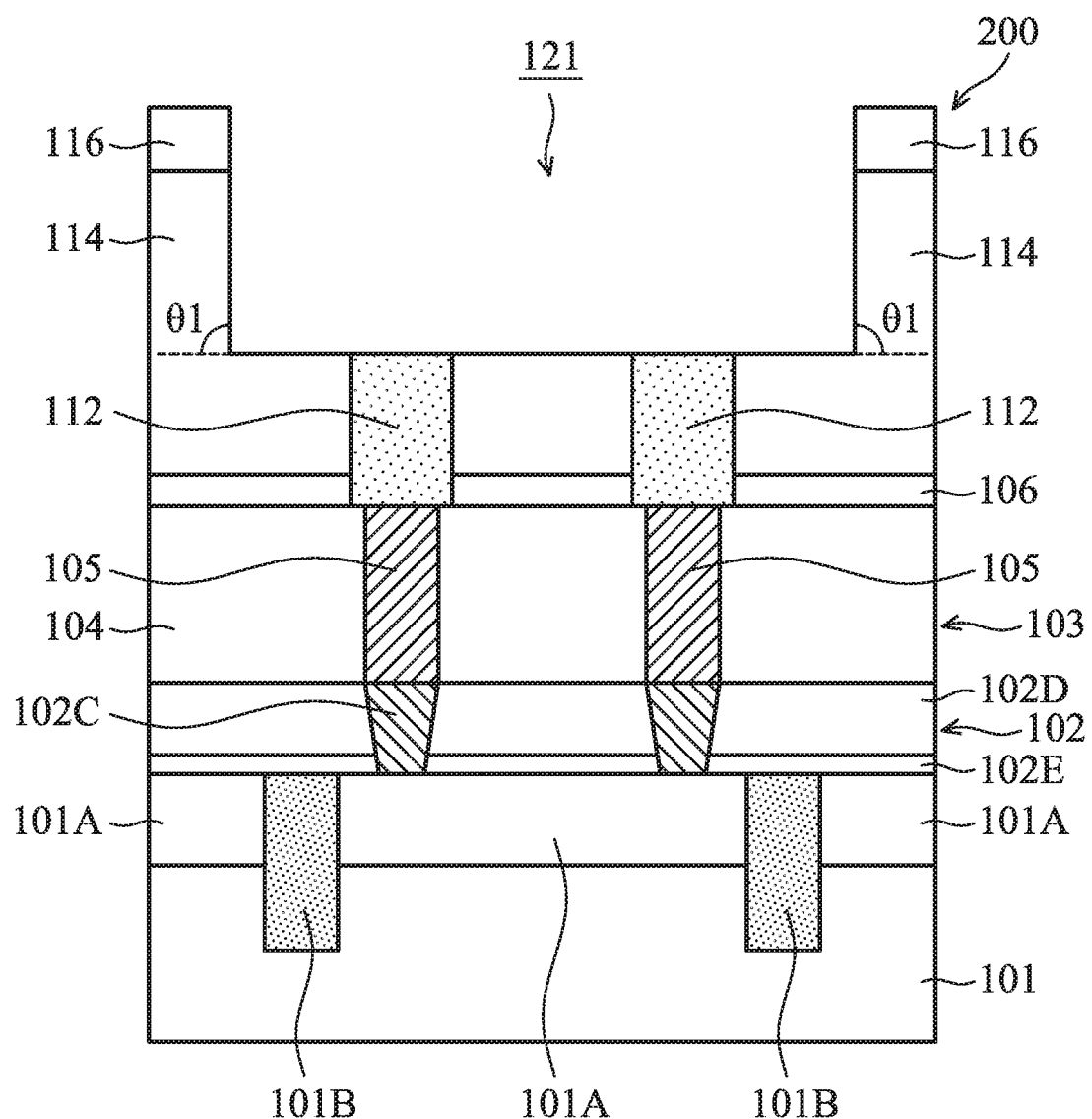
Figures 2, 2D:
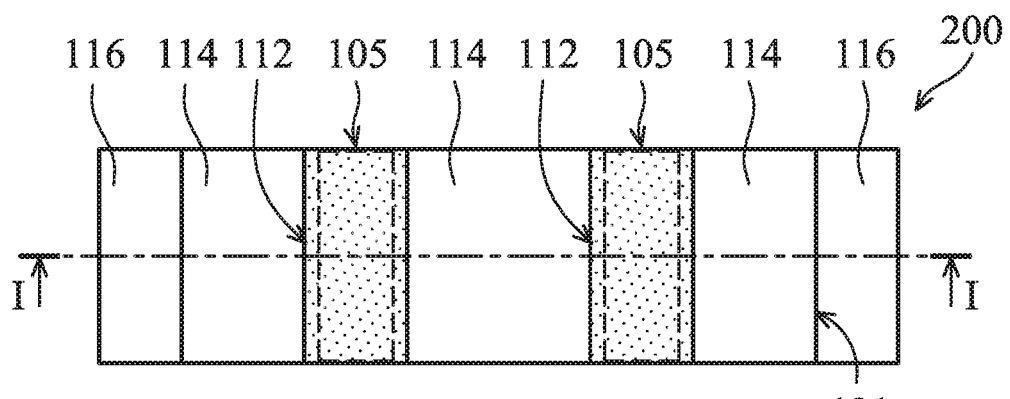
Figures 1, 2E:
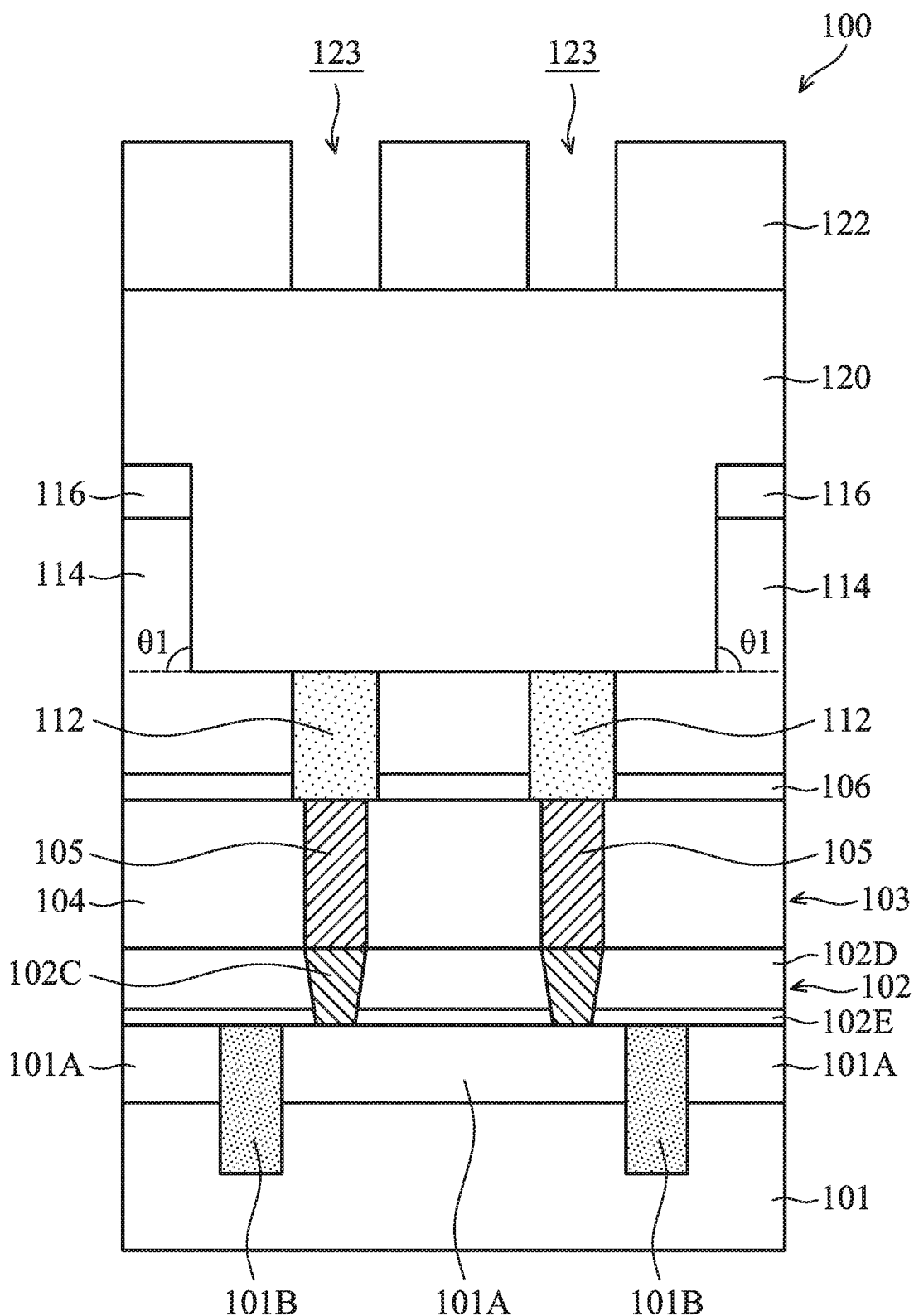
Figures 2, 2E:
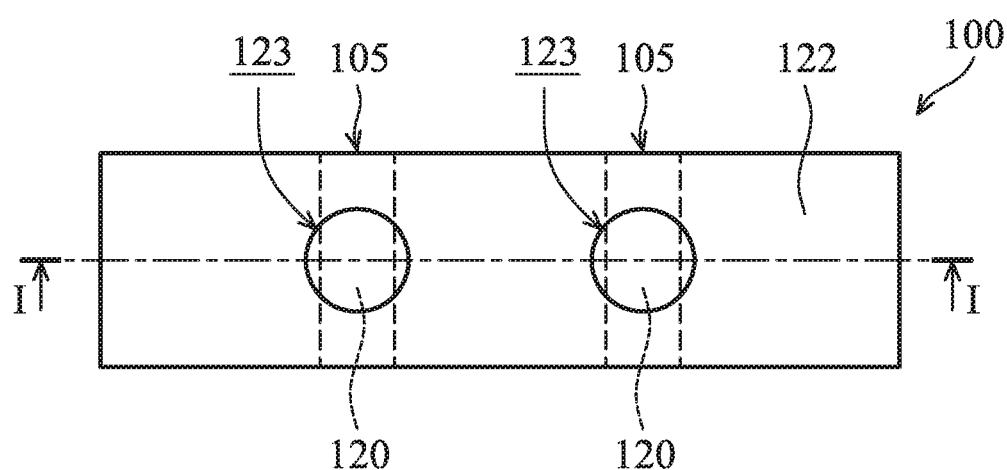
Figures 1, 2F:
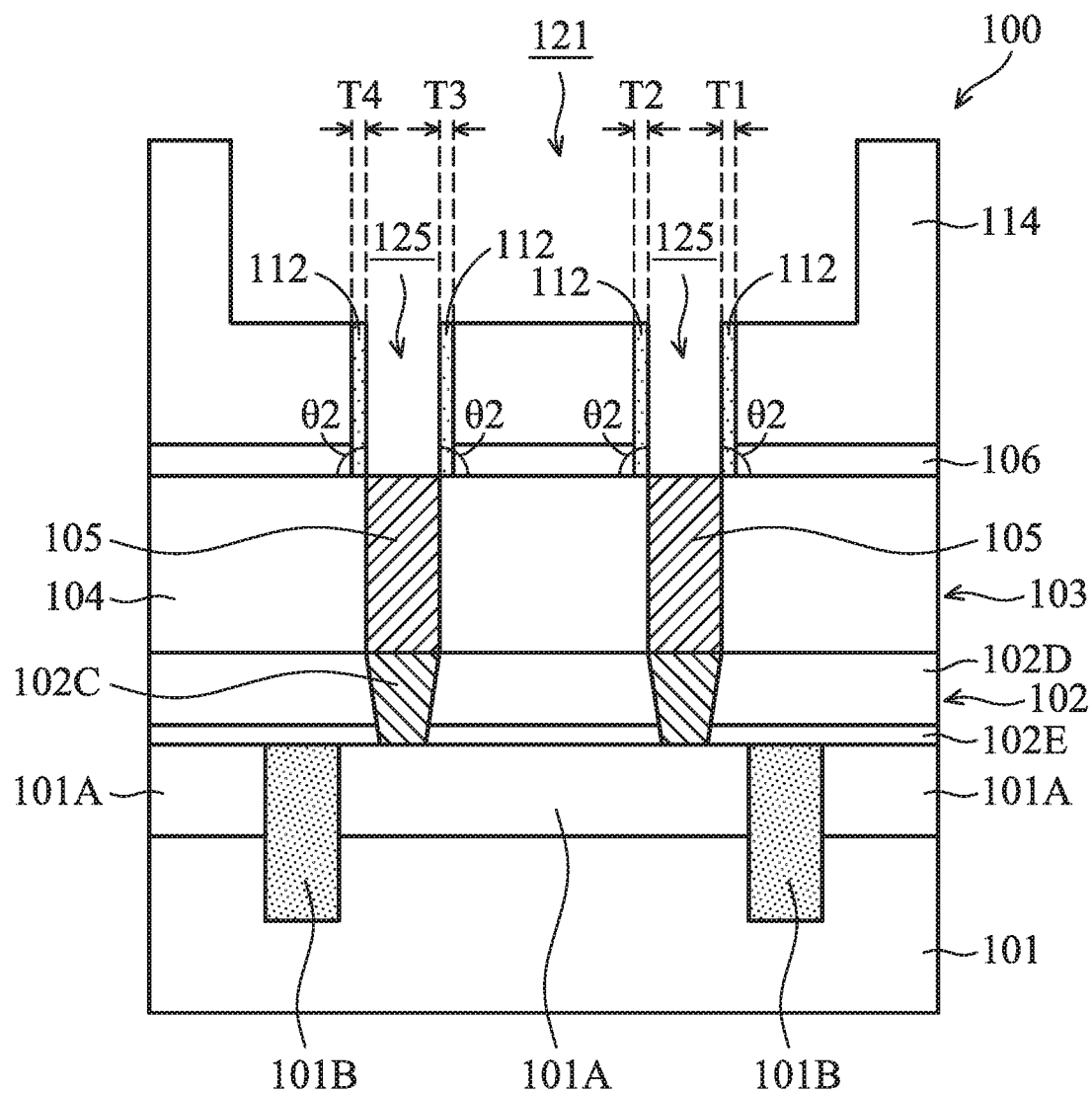
Figures 2, 2F:
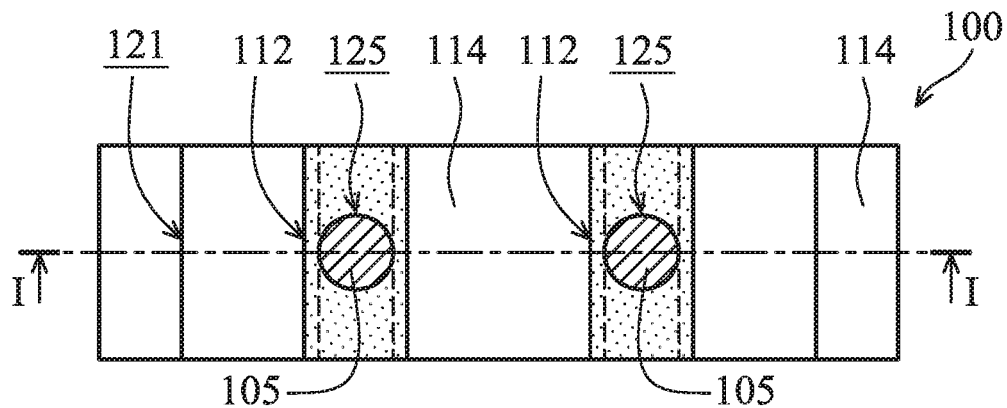
Figures 1, 2G:
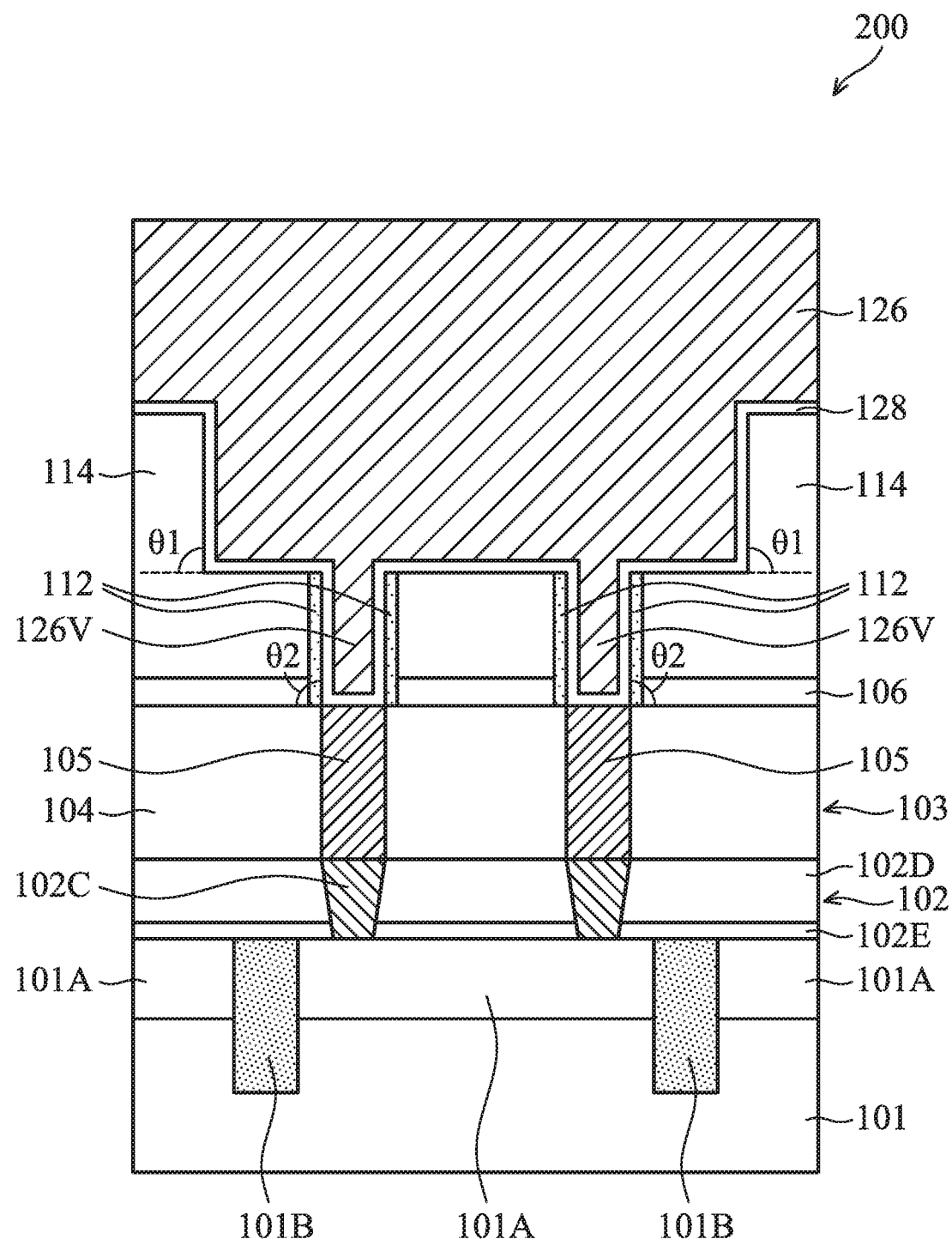
Figures 2, 2G:
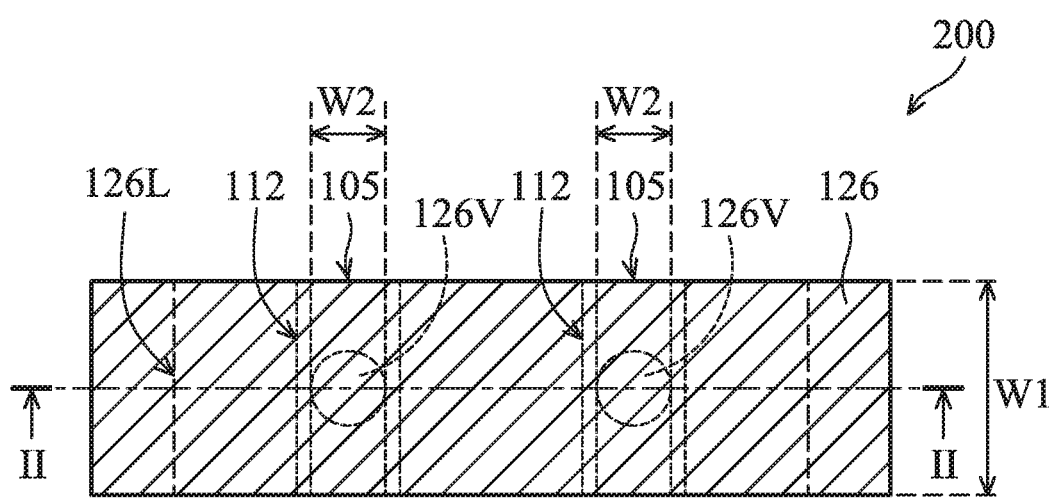
Figures 1, 2H:
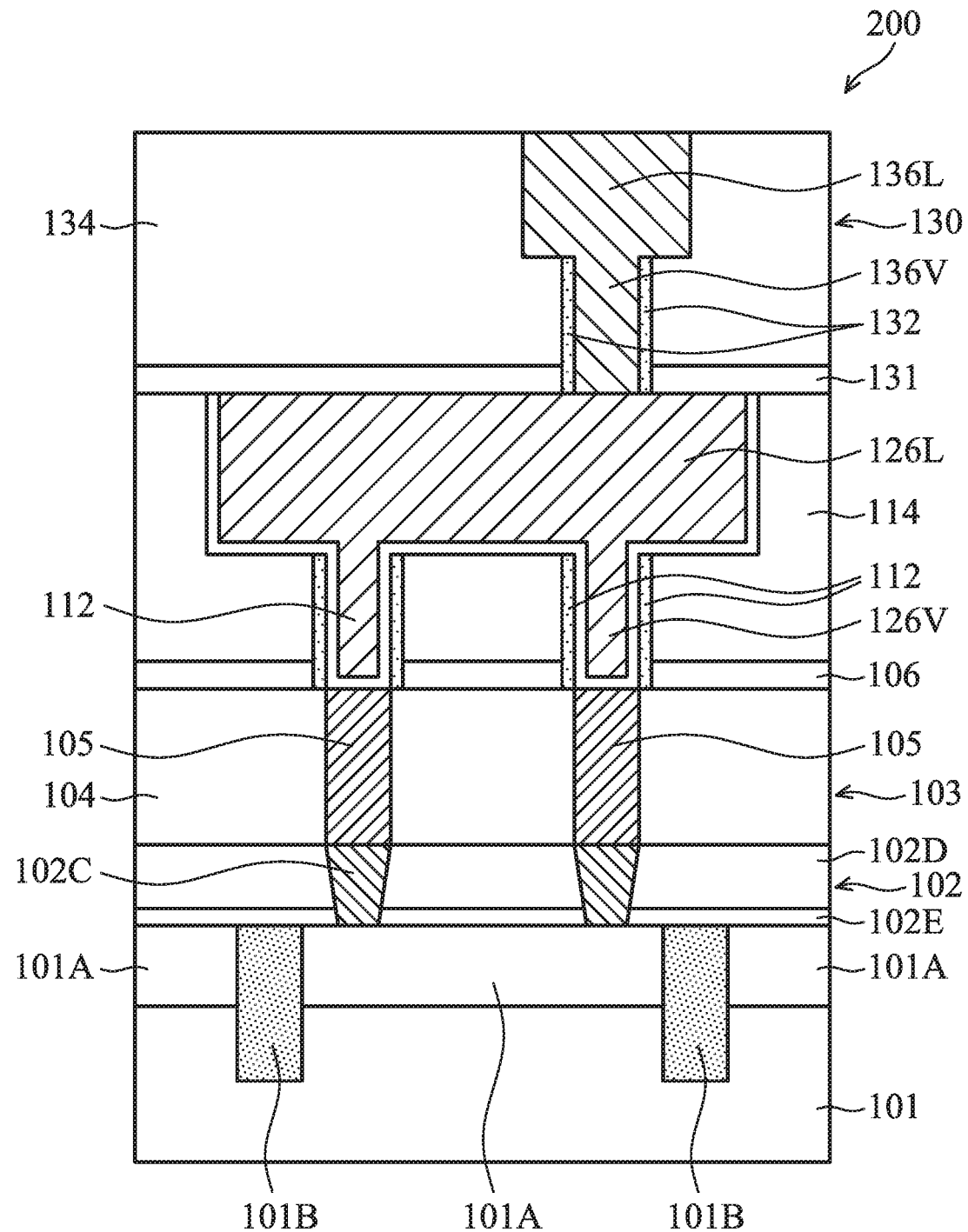
Figures 2, 2H:
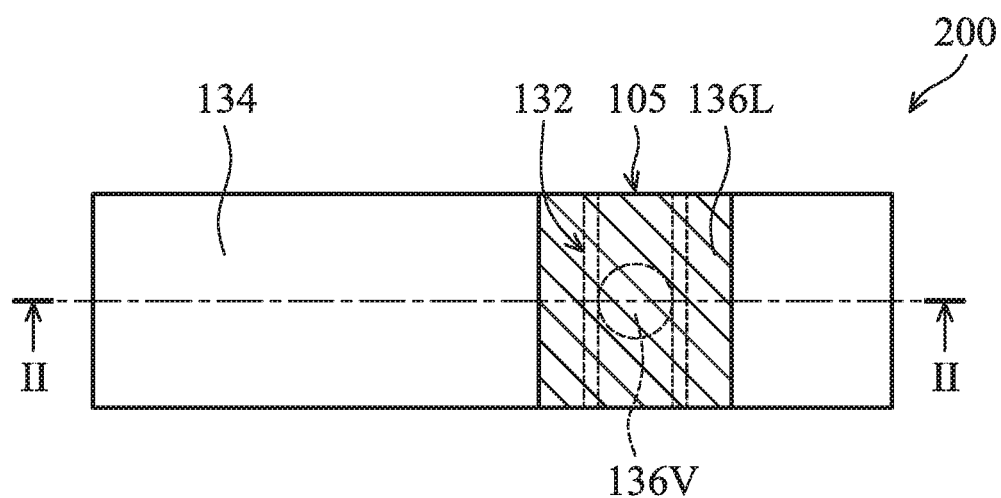

FIGS. 2A-1, 2B-1, 2C-1, 2D-1, 2E-1, 2F-1, 2G-1 and 2H-1 show cross-sectional views of structures at various stages of an exemplary method for fabricating an interconnect structure for an integrated circuit device 200, in accordance with some embodiments. FIGS. 2A-2, 2B-2, 2C-2, 2D-2, 2E-2, 2F-2, 2G-2 and 2H-2 show top views of the structures of FIGS. 2A-1 to 2H-1 at various stages of the exemplary method for fabricating the interconnect structure for the integrated circuit device 200, in accordance with some embodiments. The cross-sectional views of the structures of FIGS. 2A-1 to 2H-1 are taken along line II-II of FIGS. 2A-2 to 2H-2, respectively.

Following the steps of a fabrication process such as those described above with respect to FIGS. 1A-1 to 1D-1, a dielectric film 112' may be deposited on the BARC layer 108 and in the openings 109' (FIG. 1D-1) of the BARC layer 108 and the etch stop layer 106, as shown in FIG. 2A-1 in accordance with some embodiments. The material and process for forming the dielectric film 112' may be the same as or similar to those described above with respect to the dielectric film 112 of FIG. 1E-1. FIG. 2A-2 shows a top view of the structure of FIG. 2A-1 in accordance with some embodiments. The cross-sectional view of FIG. 2A-1 is taken along line II-II of FIG. 2A-2. The dielectric film 112' covers the BARC layer 108 and in the openings 109' to cover the metal lines 105.

Afterwards, the excess portion of the dielectric film 112' deposited on the BARC layer 108 is removed by a planarization process, for example a CMP process, to form dielectric bumps 112, as shown in FIG. 2B-1 in accordance with some embodiments. The top surfaces of the dielectric bumps 112 are level with the top surface of the BARC layer 108. In some examples, the dielectric bumps 112 have a height that is in a range from about 30 Å to about 800 Å. The dielectric bumps 112 pass through the etch stop layer 106 to be in contact with the metal lines 105. FIG. 2B-2 shows a top view of the structure of FIG. 2B-1 in accordance with some embodiments. The cross-sectional view of FIG. 2B-1 is taken along line II-II of FIG. 2B-2. The shape of dielectric bumps 112 may be a rectangle that is parallel to and aligned with the metal lines 105. The dielectric bump 112 may be wider than the metal line 105, such that the dielectric bumps 112 are in contact with portions of the dielectric layer 104.

Next, the BARC layer 108 is removed and the dielectric bumps 112 are remained on the metal lines 105, as shown in FIG. 2C-1 in accordance with some embodiments. The BARC layer 108 is removed by a wet etching process or a dry etching process that is the same as or similar to those described above with respect to the process of removing the BARC layer 108 in FIG. 1F-1. FIG. 2C-2 shows a top view of the structure of FIG. 2C-1 in accordance with some embodiments. The cross-sectional view of FIG. 2C-1 is taken along line II-II of FIG. 2C-2. After the BARC layer 108 is removed, the etch stop layer 106 is exposed. The dielectric bumps 112 pass through the etch stop layer 106 and cover the metal lines 105, respectively.

Afterwards, a dielectric film 114 is deposited on the etch stop layer 106 to cover the dielectric bumps 112 and a hard mask layer 116 is deposited on the dielectric film 114. Next, the dielectric film 114 and the hard mask layer 116 are etched to form a trench 121, as shown in FIG. 2D-1 in accordance with some embodiments. The materials and the processes of forming the dielectric film 114 and the hard mask layer 116 are the same as or similar to those described above with respect to the dielectric film 114 and the hard mask layer 116 of FIG. 1G-1. According to the embodiments of the disclosure, the material of the dielectric film 114 is different from the material of the dielectric bumps 112. The dielectric bumps 112 have an etching rate that is higher than the etching rate of the dielectric film 114 in an etching process of forming via holes. In addition, the trench 121 is formed by photolithography and etching processes that are the same as or similar to those described above with respect to the process of forming the trench 121 in FIGS. 1H-1 to 1I-1. After the trench 121 is formed in the dielectric film 114 to expose the top surfaces of the dielectric bumps 112, the etching process is stopped on the dielectric bumps 112.

There is an angle θ1 between the sidewall of the trench 121 and the extending horizontal plane of the bottom surface of the trench 121 at the side of the dielectric film 114, as shown in FIG. 2D-1 in accordance with some embodiments. In some examples, the angle θ1 is in a range from about 50 degrees to about 90 degrees. FIG. 2D-2 shows a top view of the structure of FIG. 2D-1 in accordance with some embodiments. The cross-sectional view of FIG. 2D-1 is taken along line II-II of FIG. 2D-2. The dielectric bumps 112 are exposed through the trench 121. The shape of the trench 121 may be a rectangle that has a longitudinal direction perpendicular to the longitudinal direction of the metal lines 105.

Afterwards, a BARC layer 120 is deposited on the hard mask layer 116 and fills the trench 121, and a patterned photoresist layer 122 is formed on the BARC layer 120, as shown in FIG. 2E-1 in accordance with some embodiments. The material and process for forming the BARC layer 120 and the patterned photoresist layer 122 may be the same as or similar to those described above with respect to the BARC layer 120 and the patterned photoresist layer 122 of FIG. 1J-1, except for the patterned photoresist layer 122 of FIG. 2E-2 having multiple openings 123. FIG. 2E-2 shows a top view of the structure of FIG. 2E-1 in accordance with some embodiments. The cross-sectional view of FIG. 2E-1 is taken along line II-II of FIG. 2E-2. The openings 123 of the patterned photoresist layer 122 are aligned with the metal lines, respectively. The openings 123 are situated on the respective dielectric bumps 112 over the respective metal lines 105 for forming multiple via holes in the respective dielectric bumps 112. The shape of the openings 123 may be a circle, an ellipse, a square, a rectangle, a polygon or another shape, and may be wider than the metal lines 105.

Afterwards, the BARC layer 120 and the dielectric bumps 112 are etched using the patterned photoresist layer 122 as an etch mask to form multiple via holes 125, as shown in FIG. 2F-1 in accordance with some embodiments. The metal lines 105 are exposed through the respective via holes 125. The via holes 125 are formed in the dielectric film 114 and surrounded by the remaining portions of the dielectric bumps 112. The etching process of forming the via holes 125 is anisotropic and has an etching selectivity to the materials of the dielectric bumps 112 and the dielectric film 114. The etching process is the same as or similar to those described above with respect to the etching process of FIG. 1K-1. In the etching process, the dielectric bumps 112 have an etching rate that is higher than the etching rate of the dielectric film 114. In some embodiments, an etching selectivity of the dielectric bumps 112 to the dielectric film 114 is in a range between 6 and 20. Therefore, the portions of the dielectric film 114 around the dielectric bumps 112 are not damaged by the etching process. According to the embodiments of the disclosure, the via holes 125 are formed by etching the dielectric bumps 112, which can be referred to as self-aligned via hole etching. Furthermore, conductive vias are subsequently formed in the via holes 125 and can avoid via top rounding, via overlay shift and enlarged critical dimension (CD) issues.

FIG. 2F-2 shows a top view of the structure of FIG. 2F-1 in accordance with some embodiments. The cross-sectional view of FIG. 2F-1 is taken along line II-II of FIG. 2F-2. A portion of the metal lines 105 are exposed through the via holes 125. The shape of the via holes 125 may be a circle, an ellipse, a square, a rectangle, a polygon or another shape, and may be wider than the metal lines 105.

There is an angle θ2 between the sidewall of the via hole 125 and the bottom surface of the remaining portion of the dielectric bump 112 or the top surface of the dielectric layer 104, as shown in FIG. 2F-1 in accordance with some embodiments. In some examples, the angle θ2 is in a range from about 40 degrees to about 90 degrees. The remaining portions of the dielectric bumps 112 surround the via holes 125. The remaining portions of the dielectric bumps 112 on the sidewalls of the via holes 125 have thicknesses T1, T2, T3 and T4. In some examples, the thicknesses T1, T2, T3 and T4 are in a range from 0 nm to about 10 nm. In some instances, the thicknesses T1, T2, T3 and T4 are almost equal. In some instances, the thicknesses T1, T2, T3 and T4 are different from each other.

Next, a liner 128 is conformally deposited on the dielectric film 114 and in the trench 121 and the vias holes 125 (FIG. 2F-1), and then a conductive material 126 is deposited on the liner 128 to fill the trench 121 and the via hole 125, as shown in FIG. 2G-1 in accordance with some embodiments. The liner 128 may be used as a diffusion barrier layer, an adhesion layer, or a combination thereof. The material of the liner 128 is for example titanium, titanium nitride, tantalum, tantalum nitride, or a combination thereof, and may be deposited by ALD, PECVD, PVD, or another deposition technique. In some examples, the liner 128 has a thickness that is in a range from about 5 Å to about 25 Å. The conductive material 126 includes Ta, TaN, TiN, Cu, Co, Ru, Mo or W. The conductive material 126 may be deposited using PVD, CVD, ALD, ECP, ELD or a spin-on coating process at a temperature of about 150° C. to about 400° C. FIG. 2G-2 shows a top view of the structure of FIG. 2G-1 in accordance with some embodiments. The cross-sectional view of FIG. 2G-1 is taken along line II-II of FIG. 2G-2. The conductive material 126 covers the dielectric film 114 and the metal lines 105, and fills the trench 121 and the via holes 125. The portion of the conductive material 126 in the trench 121 has a width W1 that is in a range from about 10 nm to about 300 nm. In addition, the portion of the conductive material 126 in the trench 121 has a thickness that is in a range from about 10 Å to about 1000 Å. The portion of the conductive material 126 in the via holes 125 has a width W2 that is in a range from about 5 nm to about 300 nm. The portion of the conductive material 126 in the via holes 125 has a thickness that is in a range from about 10 Å to about 1000 Å.

Next, the excess portions of the liner 128 and the conductive material 126 on the dielectric film 114 are removed by a planarization process, for example a CMP process, to form a conductive line 126L and multiple conductive vias 126V under the conductive line 126L, as shown in FIG. 2H-1 in accordance with some embodiments. The conductive line 126L has a top surface that is coplanar with the top surface of the dielectric film 114. The conductive line 126L and the conductive vias 126V are embedded in the dielectric film 114 and are combined to be an interconnect layer of the interconnect structure for the integrated circuit device 200. The conductive line 126L is electrically coupled to the metal lines 105 through the conductive vias 126V.

Furthermore, an upper interconnect layer 130 is formed on the conductive line 126L, as shown in FIG. 2H-1 in accordance with some embodiments. The upper interconnect layer 130 includes an etch stop layer 131 that is deposited on the conductive line 126L and the dielectric film 114. The material and process of forming the etch stop layer 131 may be the same as or similar to those described above with respect to the etch stop layer 106 of FIG. 1A-1. In some embodiments, the upper interconnect layer 130 also includes a conductive via 136V on the conductive line 126L, and a conductive line 136L on the conductive vias 136V. The conductive via 136V and the conductive line 136L are embedded in a dielectric film 134. The conductive via 136V pass through the etch stop layer 131 to be in contact with the conductive line 126L. The material and process of forming the dielectric film 134, the conductive via 136V and the conductive line 136L may be the same as or similar to those described above with respect to the dielectric film 114, the conductive via 126V and the conductive line 126L of FIG. 1B-1 to FIG. 1M-1.

In addition, the conductive via 136V is surrounded by the remaining portion of the dielectric bump 132. The material and process of forming the dielectric bump 132 may be the same as or similar to those described above with respect to the dielectric bump 112 of FIG. 1B-1 to FIG. 1F-1. The thickness of the remaining portion of the dielectric bump 132 on the right sidewall of the conductive via 136V may be the same as or different than that on the left sidewall of the conductive via 136V. In some examples, the thickness of the remaining portion of the dielectric bump 132 on the sidewalls of the conductive via 136V is in a range from 0 nm to about 10 nm. As mentioned in the description above, the remaining portion of the dielectric bump 132 is created by self-aligned via hole etching. The conductive via 136V formed in the via hole created by self-aligned via hole etching can avoid via top rounding, via overlay shift and enlarged CD issues.

FIG. 2H-2 shows a top view of the structure of FIG. 2H-1 in accordance with some embodiments. The cross-sectional view of FIG. 2H-1 is taken along line II-II of FIG. 2H-2. The conductive line 136L has a longitudinal direction parallel to the longitudinal direction of the metal line 105. In addition, the longitudinal direction of the conductive line 136L may be perpendicular to the longitudinal direction of the conductive line 126L. Although the integrated circuit device 200 of FIG. 2H-1 shows one upper interconnect layer 130, there may be one or more upper interconnect layer 130, one or more interconnect layer with structure formed by a dual damascene process, or a combination thereof stacked with the lower interconnect layer having the conductive line 126L and the conductive vias 126V to constitute an interconnect structure for the integrated circuit device 200.

In some embodiments of the disclosure, the dielectric film 112 is deposited in the opening 109' of the BARC layer 108 (or the disposable material layer) and the etch stop layer 106. Next, the BARC layer 108 is removed and the dielectric film 112 is left on the metal lines 105 of the wiring layer 103. The portions of the dielectric film 112 remained on the metal lines 105 may be referred to as the dielectric bumps 112. Afterwards, the dielectric film 114 and the hard mask layer 116 are deposited on the etch stop layer 106 and covers the dielectric bumps 112. The dielectric film 114 and the hard mask layer 116 are then etched to form the trench 121 in the dielectric film 114. The dielectric bumps 112 are exposed through the trench 121. Next, the BARC layer 120 is deposited on the dielectric film 114 and in the trench 121. The patterned photoresist layer 122 is formed on the BARC layer 120. The opening 123 of the patterned photoresist layer 122 is aligned with one of the dielectric bumps 112. The BARC layer 120 and the dielectric bump 112 are etched using the patterned photoresist layer 122 as an etch mask to form the via hole 125. The via hole 125 is surrounded by the remaining portion of the dielectric bump 112. Next, the hard mask layer 116, the BARC layer 120 and the patterned photoresist layer 122 are removed to expose the trench 121. The via hole 125 is connected to the trench 121. Afterwards, the trench 121 and the via hole 125 are filled with the conductive material 126 to form the conductive line 126L and the conductive via 126V. The conductive line 126L and the conductive via 126V are embedded in the dielectric film 114 to be a part of the interconnect structure for the integrated circuit devices 100 and 200.

According to some embodiments of the disclosure, the dielectric bumps 112 (or the dielectric film 112) has an etching rate that is higher than the etching rate of the dielectric film 114 in the etching process for forming the via hole 125. As a result, the portions of the dielectric film 114 around the dielectric bumps 112 are not damaged during the etching process for forming the via hole 125. Therefore, the position, the profile and the critical dimension (CD) of the conductive via 126V that is subsequently formed in the via hole 125 can be controlled precisely without overlay shift, top rounding and enlarged CD issues. An enlarged CD is a large size than a predetermined value of the conductive via 126V. According to the benefits mentioned above, the embodiments of the disclosure are suitable for integrated circuit devices at technology nodes of sub-20 nm, such as 16 nm (N16) to 3 nm (N3) and beyond.

In some embodiments, a method of forming an interconnect structure for an integrated circuit device is provided. The method includes forming a wiring layer over a semiconductor device. The wiring layer includes a metal line. The method also includes forming a patterned disposable material layer over the wiring layer. The patterned disposable material layer has an opening that is aligned with the metal line. The method further includes depositing a first dielectric film in the opening and in contact with the metal line. In addition, the method includes removing the patterned disposable material layer and leaving the first dielectric film. The method also includes depositing a second dielectric film over the first dielectric film, and etching the second dielectric film to form a trench above the first dielectric film. The method further includes removing a portion of the first dielectric film to form a via hole under the trench, and depositing a conductive material in the trench and the via hole.

In some embodiments, a method of forming an interconnect structure for an integrated circuit device is provided. The method includes forming a wiring layer over a semiconductor substrate. The wiring layer includes a first metal line and a second metal line. The method also includes coating a first bottom anti-reflective coating (BARC) layer over the wiring layer, and etching the first BARC layer to form a first trench aligned with the first metal line and a second trench aligned with the second metal line. The method further includes depositing a first dielectric film in the first and second trenches, and removing the first BARC layer to leave a first dielectric bump on the first metal line and a second dielectric bump on the second metal line. In addition, the method includes depositing a second dielectric film over the first and second dielectric bumps, and forming a third trench in the second dielectric film and above the first and second dielectric bumps. The method also includes removing a portion of the first dielectric bump to form a first via hole under the third trench, and filling the third trench and the via hole with a conductive material.

In some embodiments, an interconnect structure for an integrated circuit device is provided. The interconnect structure includes a wiring layer over and electrically connected to a semiconductor device. The wiring layer includes a first metal line and a second metal line. The interconnect structure also includes a dielectric layer over the wiring layer, and a first conductive via in the dielectric layer and on the first metal line. The first conductive via is electrically connected to the first metal line. The interconnect structure further includes a first dielectric bump in the dielectric layer and surrounding the first conductive via. In addition, the interconnect structure includes a conductive line in the dielectric layer and on the first conductive via. The conductive line is in contact with the first conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure for an integrated circuit device, comprising:
    forming a wiring layer over a semiconductor device, wherein the wiring layer comprises a metal line;
    forming a patterned disposable material layer over the wiring layer, wherein the patterned disposable material layer has an opening that is aligned with the metal line;

depositing a first dielectric film in the opening and in contact with the metal line;
removing the patterned disposable material layer and leaving the first dielectric film;
depositing a second dielectric film over the first dielectric film;
etching the second dielectric film to form a trench above the first dielectric film;
removing a portion of the first dielectric film to form a via hole under the trench, wherein the first dielectric film has a remaining portion that surrounds the via hole; and
depositing a conductive material in the trench and the via hole.

2. The method as claimed in claim 1, further comprising:
coating a bottom anti-reflective coating (BARC) layer over the second dielectric film and in the trench;
forming a patterned photoresist layer on the BARC layer, wherein the patterned photoresist layer has an opening that is aligned with the portion of the first dielectric film; and
etching the BARC layer and the first dielectric film to form the via hole.

3. The method as claimed in claim 1, wherein the first dielectric film has an etching rate that is higher than an etching rate of the second dielectric film in an etching process of removing the portion of the first dielectric film.

4. The method as claimed in claim 1, wherein the patterned disposable material layer comprises a patterned bottom anti-reflective coating (BARC) layer that is formed in an etching process using a patterned photoresist layer as an etch mask.

5. The method as claimed in claim 1, wherein the first dielectric film has a top surface that is level with a top surface of the patterned disposable material layer.

6. The method as claimed in claim 1, further comprising etching back the first dielectric film in the opening to have a top surface that is lower than a top surface of the patterned disposable material layer.

7. The method as claimed in claim 1, wherein the first dielectric film in the opening has a width greater than that of the metal line.

8. The method as claimed in claim 1, wherein the via hole is narrower than the opening.

9. The method as claimed in claim 1, wherein a sidewall of the first dielectric film is exposed after removing the patterned disposable material layer.

10. A method of forming an interconnect structure for an integrated circuit device, comprising:
forming a wiring layer over a semiconductor substrate, wherein the wiring layer comprises a first metal line and a second metal line;
coating a first bottom anti-reflective coating (BARC) layer over the wiring layer;
etching the first BARC layer to form a first trench aligned with the first metal line and a second trench aligned with the second metal line;
depositing a first dielectric film in the first and second trenches;
removing the first BARC layer to leave a first dielectric bump on the first metal line and a second dielectric bump on the second metal line, wherein a sidewall of the first dielectric bump is exposed after removing the first BARC layer;
depositing a second dielectric film over the first and second dielectric bumps, wherein the second dielectric film covers top surfaces and sidewalls of the first and second dielectric bumps;
forming a third trench in the second dielectric film and above the first and second dielectric bumps;
removing a portion of the first dielectric bump to form a first via hole under the third trench; and
filling the third trench and the first via hole with a conductive material.

11. The method as claimed in claim 10, wherein the second dielectric bump remains under the third trench after the first via hole is formed.

12. The method as claimed in claim 10, wherein a portion of the second dielectric bump is removed to form a second via hole under the third trench, and the second via hole is filled with the conductive material.

13. The method as claimed in claim 10, further comprising:
depositing a hard mask layer on the second dielectric film;
forming a first patterned photoresist layer on the hard mask layer;
etching the hard mask layer and the second dielectric film to form the third trench; and
removing the first patterned photoresist layer.

14. The method as claimed in claim 13, further comprising:
coating a second BARC layer on the hard mask layer and in the third trench;
forming a second patterned photoresist layer on the second BARC layer, wherein the second patterned photoresist layer has an opening that is aligned with the first dielectric bump;
etching the second BARC layer and the first dielectric bump to form the first via hole; and
removing the second patterned photoresist layer, the second BARC layer and the hard mask layer.

15. The method as claimed in claim 10, wherein the first dielectric bump has a remaining portion that surrounds the first via hole.

16. The method as claimed in claim 10, further comprising:
depositing an etch stop layer on the wiring layer; and
removing a portion of the etch stop layer that is exposed through the first and second trenches of the first BARC layer, wherein the first and second dielectric bumps pass through the etch stop layer to be in contact with the first and second metal lines, respectively.

17. A method of forming an interconnect structure for an integrated circuit device, comprising:
forming a wiring layer over a semiconductor substrate, wherein the wiring layer comprises a metal line;
forming a patterned disposable material layer over the wiring layer, wherein the patterned disposable material layer has an opening that exposes the metal line;
forming a first dielectric bump in the opening;
removing the patterned disposable material layer;
depositing a first dielectric film over the first dielectric bump;
etching the first dielectric film to form a trench exposing the first dielectric bump;
etching the first dielectric bump to form a via hole surrounded by a remaining portion of the first dielectric bump;
depositing a liner in the trench and the via hole; and
depositing a first conductive material on the liner.

18. The method as claimed in claim 17, wherein the opening is wider than the metal line.

19. The method as claimed in claim 17, further comprising:
- forming an isolation structure surrounding an active region of the semiconductor substrate; and
- forming a contact structure layer between the wiring layer and the semiconductor substrate, wherein the contact structure layer comprises a contact electrically connected to the metal line and the active region of the semiconductor substrate.

20. The method as claimed in claim 17, further comprising:
- forming a second dielectric bump over the first conductive material and aligned with the metal line;
- depositing a second dielectric film over the second dielectric bump;
- etching the second dielectric film to expose the second dielectric bump;
- etching the second dielectric bump to form a remaining portion of second dielectric bump and expose the first conductive material; and
- depositing a second conductive material on the second dielectric film, the remaining portion of second dielectric bump and the first conductive material.

* * * * *